US008576885B2

(12) United States Patent
van Leeuwen et al.

(10) Patent No.: US 8,576,885 B2
(45) Date of Patent: Nov. 5, 2013

(54) OPTICAL PUMP FOR HIGH POWER LASER

(75) Inventors: Robert van Leeuwen, Ewing, NJ (US);
Yihan Xiong, Pennington, NJ (US);
Jean F Seurin, Princeton Junction, NJ
(US); Chuni L Ghosh, West Windsor,
NJ (US); Bing Xu, Bayside, NY (US)

(73) Assignee: Princeton Optronics, Inc., Mercerville, NJ (US)

( * ) Notice: Subject to any disclaimer, the term of this patent is extended or adjusted under 35 U.S.C. 154(b) by 147 days.

(21) Appl. No.: 13/369,581

(22) Filed: Feb. 9, 2012

(65) Prior Publication Data
US 2013/0208753 A1 Aug. 15, 2013

(51) Int. Cl.
*H01S 3/04* (2006.01)
(52) U.S. Cl.
USPC ......... 372/34; 372/36; 372/38.05; 372/50.12; 372/50.124; 372/72
(58) Field of Classification Search
USPC ............... 372/34, 36, 38.05, 50.12, 50.124
See application file for complete search history.

(56) References Cited

U.S. PATENT DOCUMENTS

| | | | |
|---|---|---|---|
| 5,315,612 A | 5/1994 | Alcock et al. | |
| 5,455,838 A | 10/1995 | Heritier et al. | |
| 5,796,771 A | 8/1998 | DenBaars et al. | |
| 5,978,407 A | 11/1999 | Chang et al. | |
| 5,982,802 A | 11/1999 | Thony et al. | |
| 6,157,663 A | 12/2000 | Wu et al. | |
| 6,888,871 B1 | 5/2005 | Zhang et al. | |
| 6,980,572 B2 * | 12/2005 | Geske | 372/15 |
| 7,430,231 B2 | 9/2008 | Luo et al. | |
| 7,949,022 B2 | 5/2011 | Miesak et al. | |
| 2003/0039284 A1 * | 2/2003 | Zheng | 372/45 |
| 2004/0150092 A1 * | 8/2004 | Morris | 257/688 |

OTHER PUBLICATIONS

Yamaguchi et al., "Efficient Nd:YAG laser end pumped by a high-power multistripe laser-diode bar with multiprism array coupling" Applied Optics, vol. 35, No. 9, 1996, pp. 1430-1435.
Delen et al., "Characteristics of laser operation at 1064 nm in Nd:YVO4 under diode pumping at 808 and 914 nm" published in the Journal of Optical Society of America B, vol. 28, No. 1, 2011, pp. 52-57.
Sangla et al., "Nd:YAG laser diode-pumped directly into the emitting level at 938 nm", Optics Express, vol. 17, No. 128, Jun. 8, 2009, pp. 10091-10097.
Hemmati et al., "3.5-W Q-switched 532-nm Nd:YAG laser pumped with fiber-coupled diode lasers", Optics Letters, vol. 19, No. 17, Sep. 1, 1994, pp. 1322-1324.

(Continued)

*Primary Examiner* — Dung Nguyen
(74) *Attorney, Agent, or Firm* — Sonali Banerjee

(57) ABSTRACT

Optical pump modules using VCSEL arrays are provided to pump optical gain media for achieving high power laser output in CW, QCW and pulse operation modes for operation. Low divergence and symmetric far-field emission from VCSELs are particularly suitable for compact arrays. VCSEL arrays configured as laser pump modules are operable at high temperatures with practically no degradation over a long period of time. VCSEL pump modules are adaptable for side- or end-pumping configurations to pump high power lasers in CW, QCW and pulse mode. Power output from VCSEL pump modules is scalable. Incorporating microlens arrays with the VCSEL arrays improve brightness of the pump modules. High power and high temperature operation of VCSEL modules make it suitable for making compact high power solid state lasers that are operable in small spaces such as, ignition of internal combustion engines, stationary power generation engines and pulsed detonation engines.

27 Claims, 18 Drawing Sheets

(56) References Cited

OTHER PUBLICATIONS

Goldberg et al., "VCSEL end-pumped passively Q-switched Nd:YAG laser with adjustable pulse energy", Optics Express, vol. 19 No. 5, Feb. 2011, pp. 4261-4267.

Seurin et al., "High-brightness pump sources using 2D VCSEL arrays", in Vertical-Cavity Surface-Emitting Lasers XIV, edited by James K. Guenter, Kent D. Choquette, Proc. of SPIE vol. 7615, 76150F—© 2010 SPIE.

Van Leeuwen et al., "High power 808 nm VCSL arrays for pumping of compact pulsed high energy Nd:YAG lasers operating at 946 nm and 1064 nm for blue and UV light generation", Solid State Lasers XX: Technology and Devices, edited by W. Andrew Clarkson, Norman Hodgson, Ramesh Shori, Proc. of SPIE vol. 7912, 79120Z—© 2011 SPIE.

* cited by examiner

OPTICAL PUMP FOR HIGH POWER LASER

BACKGROUND OF THE INVENTION

1. Field of the Invention

This invention relates to optical pumps for compact high power lasers and in particular, to high power optical pumps including Vertical Cavity Surface Emitting Laser (VCSEL) and arrays of VCSELs, for operating high power lasers in continuous wave (CW), Quasi Continuous Wave (QCW) and pulse operation modes.

2. Description of the Related Arts

Optical pumping is one of the preferred methods to operate a class of high power lasers. A high power laser typically comprise of a gain medium enclosed in a resonant feedback cavity having at least one high reflectivity surface and one partially reflective surface placed on opposite ends of the cavity, such that laser emission is emitted out of the partially reflective surface. The laser light in general is emitted along the length of the gain medium to be referred as the laser axis hereinafter for the ease of description. The gain medium may be in the form of a solid rod for example in a solid state laser, a semiconductor laser, a fiber such as an optical fiber, or a gas, liquid or a gel, either confined in a tube or an enclosure or circulated in a closed path.

In a typical high power laser, the gain medium may be pumped from one or more sides of the gain medium that are perpendicular to the laser axis using one or more high power flash lamps. In operation, optical energy from a flash lamp excites the gain medium atoms/molecules to populate a higher atomic level and creates a population inversion, a condition necessary for lasing. When the excited atoms fall back to their ground state spontaneously, photons of a specific energy (or emission wavelength) are generated. The photons so generated undergo multiple reflections between the reflective surfaces of the resonant cavity thereby, amplifying the light generated in the laser cavity that is emitted out of the cavity as laser emission. The intensity of laser emission or the output power from a laser is directly proportional to the pump power.

As the gain medium temperature rises during lasing operation, the absorption spectrum of the gain medium shifts. High power flash lamps are widely used because their emission spectrum is broad and does not require wavelength tuning to match the absorption spectrum of the laser gain medium. However, broad emission spectrum of flash lamps also is a major disadvantage because wavelength range for absorption in typical gain media is limited. Therefore, a large fraction of the optical energy from the flash lamp is not utilized effectively in pumping the gain medium and part of the pump energy is transferred as heat in the gain medium giving rise to undesirable effects including thermal lensing. Since typical gain media comprise of material that exhibit poor thermal conductivity, temperature variations in the gain medium may cause instabilities that are detrimental for high power operation in continuous wave (CW) mode, quasi-continuous mode (QCW) or in pulsed mode for example, in Q-switch mode used in applications such as wavelength conversion. Temperature instabilities may even affect the polarization properties. Therefore, to achieve stable lasing operation, elaborate cooling equipment is necessary for the laser as well as the optical pump, for stable operation particularly at high output power.

One way to mitigate some of the drawbacks of flash lamps is to use high power semiconductor lasers which have a definite edge over flash lamps. For example, semiconductor lasers may be designed for emission in a specific narrow wavelength range may be tuned specifically to match the absorption spectrum of the gain medium. Semiconductor lasers require relatively low electrical drive current as compared to flash lamps. Due to their small footprint, semiconductor lasers may be cooled using relatively small thermoelectric coolers and may be stabilized for a fixed wavelength emission for extended periods.

Two different types of semiconductor lasers namely, edge emitting laser (EEL) and vertical cavity surface emitting laser (VCSEL) have been used for optical pumping of gain media in high power lasers. While individual semiconductor lasers may not have high output power, they may be arranged in one-or two-dimensional array depending upon the type of semiconductor laser, to increase total pump power. Since semiconductor lasers or laser arrays are small, they can be placed very close to the gain medium or may even be integrated with the gain medium, in particular for a VCSEL or a VCSEL array pump. Semiconductor lasers or laser arrays may be arranged for optically pumping a gain medium from a side(s) or an end. For example, if the gain medium is in the form of a rod, in a side pumping configuration the pump power is coupled along the side(s) parallel to the length the rod. The optical pumps in this configuration are positioned along the length of the gain medium such that the light from the pump is incident perpendicular to the laser axis. In an end pumping arrangement, the pump power is coupled to the cross section at one end of the rod. Both methods of optical pumping have their merits and are described in many patent and non-patent publications.

For example, in the U.S. Pat. No. 5,315,612 issued on May 24, 1994, to Alcock et.al. a solid state laser cavity suitable for side pumping a solid state gain medium has been described. More specifically, the gain medium is pumped using an optical pump including a semiconductor laser bar comprising a large number of edge emitting lasers stacked in a one-dimensional array. The cavity design disclosed there may be used with or without collimating optics between the optical pump and the solid state gain medium.

In the U.S. Pat. No. 5,455,838 issued on Oct. 3, 1995, Heritier et.al, described a laser device by optically pumping a gain medium having rectangular cross section, using pump light from one-dimensional array of edge emitting semiconductor lasers. In this arrangement pump light is provided from the side on two opposing flat surfaces of the gain medium using cylindrical lenses attached to the gain medium surface for uniform pump light distribution along the length of the gain medium.

In the U.S. Pat. No. 5,978,407 issued to Chang et al on Nov. 2, 1999, an optical pumping arrangement using a one-dimensional arrays of edge emitting semiconductor lasers is described where a specially designed light diffuser is used to direct the pump light onto sides of a circular cross section solid state gain medium rod. The pump light traverses through light paths constructed in a specially designed segmented cylindrical light coupling structure built around the cooling arrangement of the gain medium rod.

In the U.S. Pat. No. 6,157,663 issued on Dec. 5, 2000, Wu et al. describe an optical pumping configuration to side pump an $Nd:YVO_4$ gain medium using an array of edge emitting semiconductor lasers. The pump laser array is positioned to side pump the gain medium without collimating or focusing optics. A gap between the pump laser array and the gain medium is empirically selected to match the angular extent of the pump laser output light to the height of the gain mode at the position of gain mode fixed to optimize coupling and diffraction losses.

While it is well established that edge emitting semiconductor lasers and in particular, one dimension array of such lasers provide adequate optical power to pump a solid state laser, they have some limitations. For example, emission from an edge emitting laser is elliptical and highly astigmatic having greater than 20 degrees half angle, in one dimension and a divergence of about 10 degrees in the other. Therefore, emission from an edge emitting laser requires a complex arrangement of optical components to generate a well focused narrow beam for pumping a gain medium in end-pumping configuration. In particular, in the U.S. Pat. No. 6,157,663 issued on Dec. 5, 2000, Wu et al. several limitations of end-pumping configuration in the context of a solid state gain medium has been summarized.

Different configurations for end-pumping a gain medium have been described in several patent and non-patent publications. In a publication entitled "Efficient Nd:YAG laser end pumped by a high-power multistripe laser-diode bar with multiprism array coupling" Applied Optics, vol. 35, No. 9, 1996, pp. 1430-1435, Yamaguchi et al. described a multiprism array to couple pump light from a high power edge emitting laser array bar to a Nd:YAG gain medium. An alternative method using optical fiber to couple pump laser output from edge emitting lasers or laser arrays has been described in several other non-patent publications.

In an article entitled, "Characteristics of laser operation at 1064 nm in Nd:YVO$_4$ under diode pumping at 808 and 914 nm" published in the Journal of Optical Society of America B, Vol. 28, No. 1, 2011, pp. 52-57, Délen et al. described using a large lens to focus pump light from two lasers onto a Nd:YAG gain medium. Other end-pumping configurations using optical fiber coupling from laser array or individual lasers have been described in "Nd:YAG laser diode-pumped directly into the emitting level at 938 nm" by Sangla et al, in Optics Express, Vol. 17, No. 12 8, Jun. 8, 2009, pp. 10091-10097, and "3.5-W Q-switched 532-nm Nd:YAG laser pumped with fiber-coupled diode lasers" by Hemmati et al. in Optics Letters, Vol. 19, No. 17, Sep. 1, 1994, pp 1322-1324.

Although pumping a gain medium in side-as well as end-pumping configurations has been demonstrated, edge emitting lasers have certain limitations. A high level of temperature dependence (about 0.3 nm/deg° C.), which necessitates stringent temperature control of the edge emitter laser pumps to prevent pump wavelength from drifting away from the absorption wavelength of the gain medium to avoid creating a mismatch between them. In order to stabilize emission wavelength edge emitting laser requires a dedicated thermoelectric cooler or micro-channel cooler which are cooled by liquid from a refrigeration system called chiller. In arrays of edge emitting lasers, the minimum distance that is allowed between each laser may be limited by the space required to accommodate the cooling arrangement. As a result, the maximum size of an array is determined by the number of lasers that can be placed within a desired physical space. It is also inconvenient to configure edge emitting lasers into a two-dimensional array as it requires complex assembly of edge emitter bars into stacks, as is well known in the art.

Therefore, as an alternative, VCSELs have been utilized for pumping a gain medium. A VCSEL emits a symmetrical beam having a circular cross section and a typical half and full divergence angle of 9 and 20 degrees, respectively, in both dimensions (FIG. 1 showing data from a device constructed at Princeton Optronics Inc., Mercerville, N.J.). As a result, VCSELs are easily adaptable to simple optical methods for generating or modifying the output light for a desirable illumination pattern using co-linear focusing optics which is particularly convenient for end-pumping configuration. A particularly useful optical pump configuration using a microlens integrated with a VCSEL or a VCSEL array, for applying pump power at one end of a gain medium directly or via a fiber light path, is described in the U.S. Pat. No. 6,888,871 issued to Zhang et al. on May 3, 2005 and co-owned by the assignee of this application. The content of the above mentioned patent is being incorporated by reference in its entirety.

In an article entitled "VCSEL end-pumped passively Q-switched Nd:YAG laser with adjustable pulse energy" published in Optics Express, Vol. 19 No. 5, February 2011, pp. 4261-4267, Goldberg et al. describe optical pumping of a solid state gain medium using a VCSEL array. The authors of this article acknowledge that VCSEL array described therein is developed at the Princeton Optronics Inc. who is also the assignee of this application.

In the U.S. Pat. No. 7,949,002 issued on May 24, 2011, Miesak et al. describe an optical pumping method including an array of VCSEL in a slab of laser gain medium. More importantly, the optical power is coupled to a gain medium without any coupling optics. The VCSEL array is mounted directly on the gain medium so that the gain medium and the VCSEL array share a cooling system. One advantage of this method is that increased cooling of the VCSEL array facilitates higher output power from the pump which is directly coupled to the gain medium. This approach has disadvantages however when increased pump energy is required.

One disadvantage of the method described in the Miesak patent is related to a practical limit to the size of a VCSEL array due to fabrication limitations. Thus for higher pump powers several VCSEL arrays are needed to be placed adjacent to each other. As a result there are undesirable gaps in the incident pump beam on the laser rod. To overcome this problem a diffuser plate is used to redistribute the energy more evenly along the laser rod. This diffuser adds losses to the pump beam since light is diffused away from the laser rod in some areas. An additional disadvantage is that the maximum size of the VCSEL arrays is constrained by the size of the side surface.

A second disadvantage relates to the cooling of the laser rod and the VCSEL devices. For high power lasers, cooling is required for both the laser rod and the VCSEL arrays. Locating the VCSEL arrays so close to the laser rod increases the complexity of the cooling arrangement. This is especially the case with the VCSEL arrays since they must be protected from any cooling liquid degrading the optical emitting surfaces and the electrical contacts.

A different arrangement for optically pumping a solid state gain medium is described in the U.S. Pat. No. 7,430,231 issued to Luo et al. on Sep. 30, 2008. A specially designed diffusion chamber is used to couple incoherent or partially coherent light from a VCSEL array. Light from the VCSEL arrays are coupled via slits along the length of the chamber. The slits are evenly distributed on the periphery of the diffuser chamber. In an alternative method, a compound parabolic reflector chamber is used to couple pump light to a gain medium placed at the focal point of the parabola.

There are two disadvantages of this approach. The reflection cylinder and diffusion material will cause a small amount of loss at each reflection and diffusion due to imperfections and other absorption effects. The losses from the many reflections and scattering in these components can reduce the pump light absorbed in the laser rod. The second disadvantage is that the laser beam intensity cross-section is not uniform but follows a more Gaussian type of distribution being highest intensity in the center and weaker intensity at the edges. A more efficient pumping energy distribution would be one that matches this distribution so that the highest activation power for the active ions is in the center of the solid-state laser beam.

In another non-patent publication entitled "High Power 808 nm VCSEL arrays for pumping of compact pulsed high energy Nd:YAG lasers operating at 946 nm for blue and UV light generation" published by SPIE in February 2011, an optical pump module configured for side-pumping a solid state laser gain medium is described by van Leeuwen et al., some of the authors of that paper are also applicants in this application. The content of this publication is being incorporated by reference in its entirety.

Being a surface emitting device, VCSELs are more amenable to integration with a solid state gain medium. For example, in the U.S. Pat. No. 5,796,771 issued on Aug. 18, 1998, Den Baars et al. describe a solid state laser integrated with a single VCSEL pump laser that is grown on a common substrate. In another U.S. Pat. No. 5,982,802 issued on Nov. 9, 1999, Thony et al. describe a solid state laser that is pumped by a single VCSEL device or a two-dimensional array of VCSEL devices including a microlens.

The optical pump configurations described in the prior art publications mostly disclose the use of bars of edge-emitting semiconductor laser arrays, a single VCSEL device or arrays of VCSELs, for optical pumping in a side-pumping configuration. In fact, none of the prior publications describe a system that is adaptable to side-pumping and end-pumping configuration. Furthermore, most of the prior art publications describe optical pumping methods that are particularly suited for solid state gain medium and do not disclose arrangements for other types of gain media for example, semiconductors, liquid or gel, etc. In addition, none of the prior art publications teach or suggest a pumping method that is readily adaptable for upgrading the pump power in a modular fashion.

Contrary to the prior art publications, this invention describes an optical pumping system that is adaptable for end-pumping as well as side-pumping configurations utilizing unique properties of high power VCSEL devices developed at Princeton Optronics Inc. In this invention optical pump configurations using a single VCSEL or VCSEL arrays adaptable for side pumping and end-pumping modes are provided for high power laser operations. More importantly, the optical pump systems to be described shortly may be in close proximity to the laser gain medium without interfering with the laser cavity design of the gain medium. Therefore, the pump modules provided in this invention are adaptable to work with different types of gain media used in different high power lasers including but not limited to, solid state lasers, semiconductor lasers, gas lasers, liquid or gel dye lasers, fiber lasers, etc. The optical pumping system may be constructed to conform to different shapes of the gain medium and may be modular for quick adaptation to upgrade output power to pump different volume (size) of gain media. In addition, the optical pump modules described in this invention are adaptable to emit uniform pump light to match different cross section geometry of the gain medium. The principles may be applied to construct compact high power lasers for a variety of applications.

SUMMARY OF THE INVENTION

One embodiment of the invention provides high output pump modules to optically pump a gain medium for high laser output power. The new pumps are cooled separately from the gain medium without interfering with the laser cavity cooling arrangement. Accordingly, the high power optical modules are arranged externally around a gain medium in a modular fashion for quick pump power upgrade to achieve higher laser output power. Advantageously, the optical pump modules disclosed in this invention are adaptable for any gain medium including, solid state, semiconductor, gaseous, liquid or gel, optical fiber, etc.

One aspect of the optical pump for high power lasers is that the pump modules include VCSEL or VCSEL arrays that are not affected by back reflections or reflections incident from other sources. Accordingly, in a side-pump configuration a pump module is placed directly opposite to another pump module across the gain medium such that the pump energy not absorbed by the gain medium in each pass is reflected from the oppositely placed pump module. As a result, pump light from the pump modules pass the gain medium multiple times thereby, utilizing the pump power more efficiently. Accordingly, the gain medium may be operated by a compact cooling arrangement, thereby reducing the overall size and operational complexity.

In one aspect of the invention, since the VCSEL pump modules may be upgraded for higher pump power. Therefore, by simply changing the VCSEL pump module to a higher power pump module higher laser output power may be achieved from the same gain medium without redesigning the entire laser system. In another aspect, higher output power may be achieved by adding more segments to the gain medium in a modular fashion. In a variant embodiment, multiple pump modules may be assembled to circumferentially pump gain medium having different cross section shapes including but not limited to, square, rectangular, planar thin prism, circular and hexagonal.

In a different embodiment of the invention high power pump modules are provided by VCSEL arrays or by tiling multiple VCSEL arrays into a quad array, disposed on a common thermal submount. One aspect of the pump modules is the ability to operate pump modules at high temperature. Accordingly, the pump modules provided in this invention may be operated without external cooling for low power operation or by providing simple cooling arrangements that include but are not limited to, air cooling fins, liquid cooling by circulating liquid in micro-channels or cooling along with the gain medium.

VCSEL pump modules may be made very compact and may be assembled with gain medium in very compact high power lasers that operate in high temperature environment. In one aspect of the invention, a compact high power solid state laser is provided for generating pulses for ignition in an internal combustion engine chamber such as for automobile engines or stationary engines used for power generation or for pulsed detonation engines (PDE) for aircraft propulsion.

In another aspect of the invention, light from VCSEL pump modules may be focused using simple optical components well known in the art, that include but are not limited to, plano-convex lens, plano-convex lens doublets, a tapered adiabatic waveguide, Fresnel lens, etc. in a co-linear arrangement. As a consequence, light from VCSEL pump modules may be focused on to a very small area for pumping the gain medium from one or both ends. The same optical components may also be utilized for pumping a gain medium in a side-pumping configuration by simply selecting other optical components that may include a microlens array to expand and collimate each VCSEL beam in an array and combine them into a uniform cohesive pump beam covering a large area using a focusing lens. Advantageously, a cohesive pump beam may be focused to a smaller spot for more intense uniform pumping with much higher brightness level.

In one embodiment of the invention a laser system is provided where a gain medium is dual end-pumped by assembling one pump module with the gain medium in a co-linear arrangement and a second pump module arranged at a right angle to the gain medium. In a variant embodiment, both the pump modules are arranged to pump the gain medium co-linearly from the opposite ends.

BRIEF DESCRIPTION OF THE DRAWINGS

The accompanying drawings incorporating one or more aspects of the present invention in different figures form a part of the specification. The embodiments of the invention will be more clearly understood when the following detailed description is read in conjunction with the accompanying drawing figures in which.

DETAILED DESCRIPTION OF THE INVENTION

Different aspects presented separately in the preferred embodiments are intended to provide a broader perspective of the invention. For clarity and ease of discussion, each drawing figure shows a particular aspect or a combination of few aspects that may be implemented in an embodiment either alone or, in combination with one or more aspects shown in other embodiments. An element not shown in any particular embodiment is not be construed as precluded from the embodiment unless stated otherwise. Different combinations and sub-combinations of various aspects that may occur to those skilled in the art are covered within the broader framework of the detailed description of the invention presented in the following section.

Figure 1:
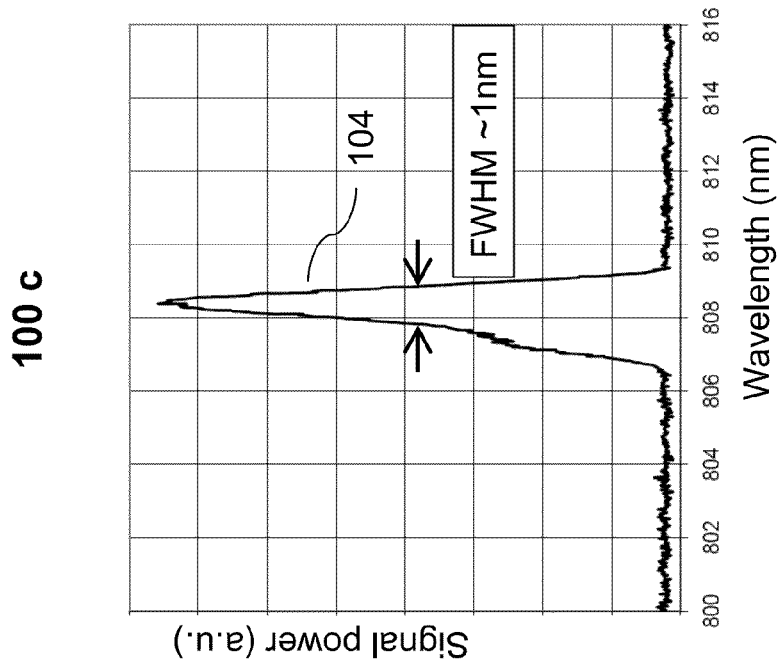
FIG. 1 shows structure, far-field emission pattern and spectral properties for a typical VCSEL device.
Figure 1:
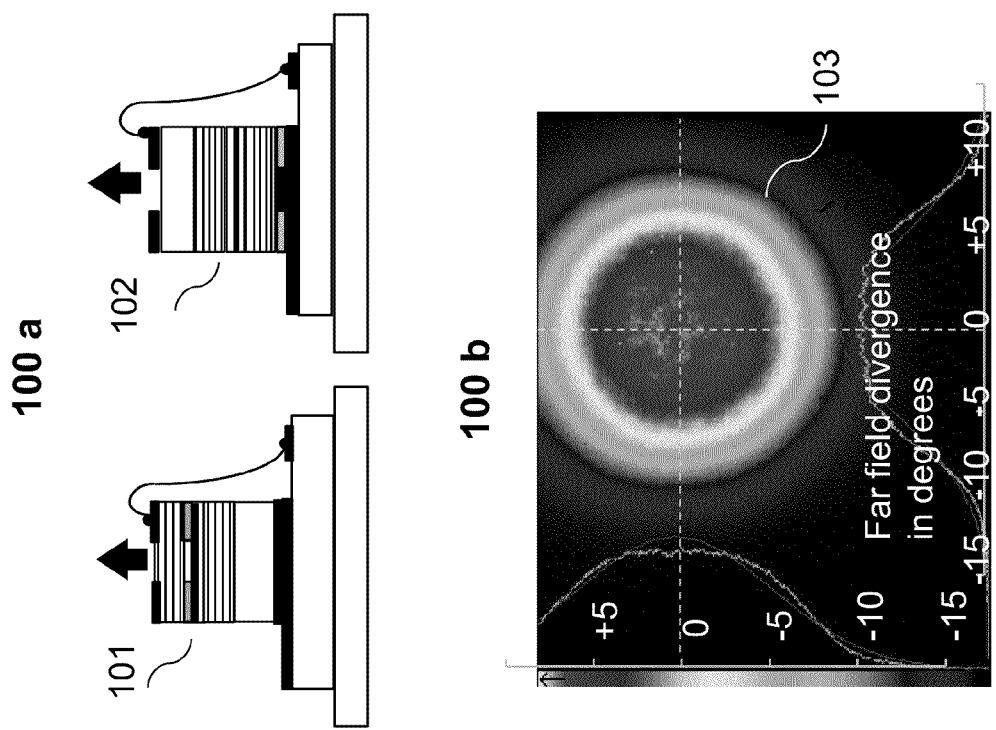

Referring now to FIG. 1, schematic of typical VCSEL devices constructed at Princeton Optronics Inc. are shown in 100a together with exemplary far-field emission pattern and emission spectrum shown in 100b and 100c, respectively. Detail description of these devices are disclosed in a pending U.S. patent application Ser. No. 13/337,098 filed on Dec. 24, 2011, by Seurin et al, which is being incorporated by reference in its entirety. More particularly, in a top-emitting VCSEL device 101 mounted on a heat spreading thermal submount, light (shown by the bold arrow) is emitted from the top side of the device (opposite to the substrate end). In an alternative bottom emitting configuration 102, light (shown by the bold arrow) is emitted from a window in the substrate; accordingly, the device is mounted upside down on a thermal submount. For better thermal communication between the VCSEL device and the thermal submount, the substrate may be reduced to a very small thickness or in some applications, may be removed entirely.

An exemplary far-field emission pattern 103 from such a VCSEL device is symmetric along both axes having typical full divergence angles within 20 degrees in each direction. Due to symmetric emission pattern from a VCSEL, simple optical methods such as providing current confining apertures or external beam shaping devices such as lenses, diffusers, etc. may be used to shape a VCSEL output beam that include but is not limited to, a Gaussian, flat top or ring shape pattern. Examples of beam shaping using current confining apertures are described in a United State patent application Ser. No. 13/337,098 filed on Dec. 24, 2011, and co-authored by some of the inventors of this application, and co-owned by the same assignee, the content of which is being incorporated by reference in its entirety.

The emission spectrum 104 exhibits a very narrow peak at about 808 nm with a linewidth (full-width at half-maximum, labeled "FWHM" in FIG. 1) of the order of about 1 nm. It must be noted that the emission spectrum of the VCSEL matches quite well with the absorption spectrum of a Nd:YAG crystal which is a very common gain medium used in a high power solid state laser. Advantageously, the VCSEL emission peak may be tuned to match absorption spectra of other gain media by designing and constructing the VCSEL to emit at a desired wavelength using same or different types of semiconductor materials. In exemplary multimode and single mode VCSEL devices optical power of about 5 W and 1 W, respectively, is achieved at Princeton Optronics Inc. The temperature variation of about 0.07 nm/° C. is quite typical, resulting in 4 nm or less shift over a range of about 60° C. change in temperature in these devices. Therefore, a VCSEL device may be reliably operated in a wide range of temperature without significant drift in the peak wavelength.

There are several advantages of the small size of VCSEL devices for their application in optically pumping gain media and in particular, as optical pumps for solid state laser. VCSEL emission wavelength is highly insensitive to operating temperature; therefore, emission wavelength does not change significantly relative to the gain medium absorption spectrum. Unlike the edge-emitting lasers, VCSELs are less prone to Catastrophic Optical Damage (COD) or other types of thermal degradation. Therefore, they are highly reliable even when operated at significantly higher temperatures as much as 150-200° C. using inexpensive cooling methods including but not limited to, convection, forced air, or simple radiator-type water cooling that are simple, small, rugged, and with low power consumption are adequate. VCSELs can reliably operate in enclosed environment making them particularly suitable for applications such as laser spark plugs for ignition of internal combustion engines or pulse detonation engines. Advantageously, the reduction of the complexity and the size and simplicity of the cooling systems result in high output power in a small footprint design.

VCSELs and in particular, single mode VCSELs are very high speed devices and can be operated with pulse duration of the order of nanosecond or less, and rise times of sub-nanoseconds. This aspect of VCSELs is particularly beneficial for pumping a gain medium upper state that has a relatively short lifetime. More energy can be pumped into the upper state before the upper state depopulates reducing its accumulated energy. For example, for an Nd:YAG solid-state laser system, the pump is typically operated at a pulse width of 250 microsecond whereas the lifetime of the upper state in a Nd:YAG gain medium is around 200 microsecond. Therefore optical pump modules including VCSEL devices are beneficial in pumping a gain media for a quasi-continuous wave (QCW) mode operation where typical pulse width of output from a laser is of the order of 100 microsecond to a few millisecond. The high speed of pump modules according to this invention is also beneficial for Q-switching operation where it is important to pump the laser upper state as quickly as possible before turning on the Q-switch to obtain very high power output pulse at a high repetition rate.

Figure 2:
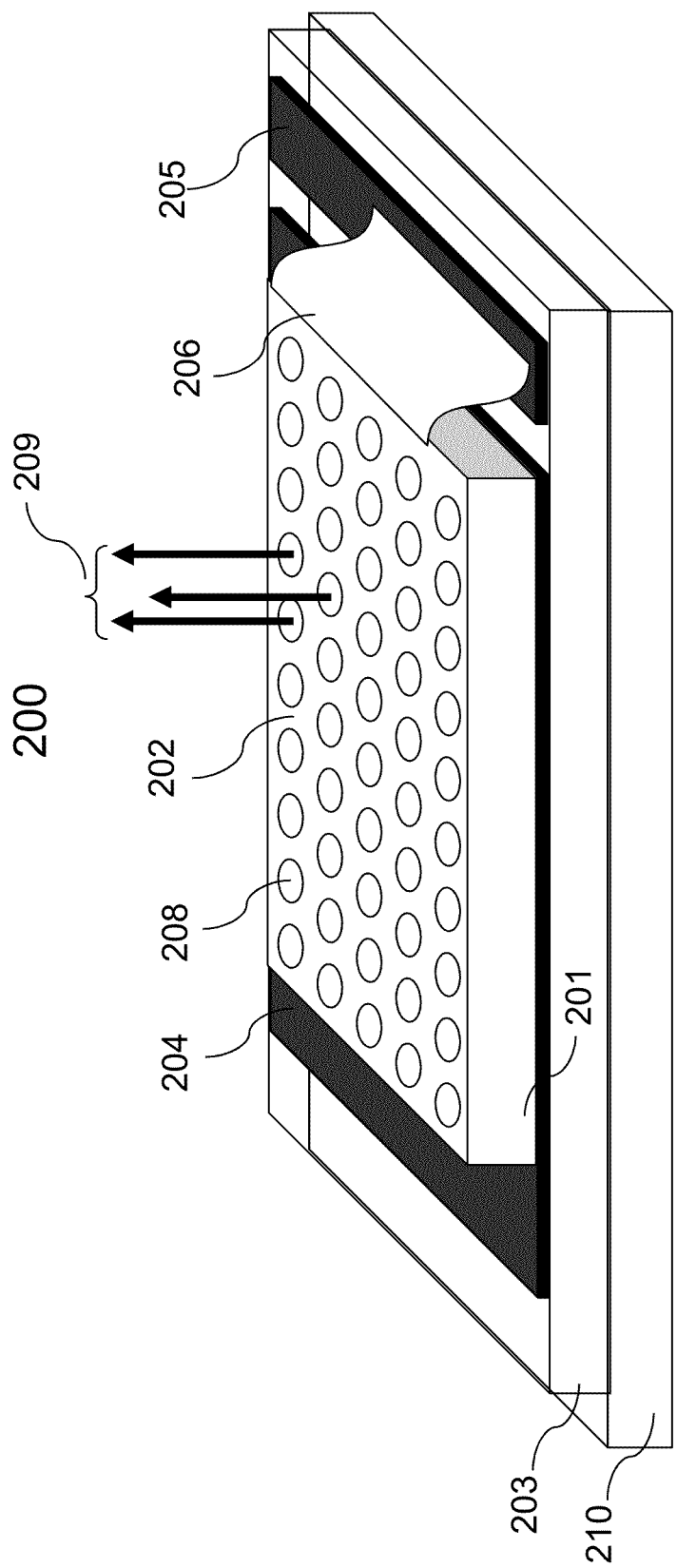
FIG. 2 shows a basic VCSEL array building block on a heat spreading sub-mount.

Due to a small size and surface emission aspect of the device, many VCSELs may be arranged in very compact one- or two-dimensional arrays to achieve high output power. In one embodiment of the invention shown in FIG. 2, VCSEL array is configured on a thermal submount which is described in detail in a pending U.S. patent application Ser. No. 13/337,098 filed on Dec. 24, 2011, by Seurin et al, which is being incorporated by reference in its entirety. More specifically, a two dimensional array 202 comprising a plurality of VCSELs 208 (only one is labeled for clarity) is constructed on a common substrate 201. The plurality of VCSELs in this example may be top emission (101) or bottom emission type (102), as long as they are mounted to emit in the same direction (upward in this example) as shown by a representative set of arrows 209 for clarity.

A first electrode of each VCSEL is connected together to a common first terminal of the array which in this example is located underside of the substrate 201. A second electrode of each VCSEL is connected together by the metallization on the top surface of the array between the individual VCSEL. In some applications to be described later, the top surface metallization advantageously provide a highly reflective surface. The top metalized surface forms the second terminal of the array. The metalized area on the top surface between the VCSELs is highly reflective. The underside of the substrate of the VCSEL array which is the common first electrode in this example will be referred as the bonding surface and the top surface of the array will be referred as the emitting surface of the array.

The common substrate, is bonded to a large area bonding pad 204 located on a thermal submount 203 to ensure a good thermal contact between the VCSEL array and the thermal submount. To further improve the thermal contact, the substrate thickness is substantially reduced or even entirely removed. In that situation the VCSEL array is directly bonded on a contact pad on the thermal submount which is an important aspect of this invention, in particular, for improving pump performance below ~940 nm emission wavelength. The materials used to construct the submount include but are not limited to, ceramic, metal embedded plastic, diamond, Beryllium Oxide (BeO), Aluminum Nitride (AlN), and other materials known to exhibit high thermal conductivity. Multiple wire bonds or a common wide bonding ribbon 206, provides a very low inductance connection to a common second electrode located on the emitting surface, to a second large area bonding pad 205 also located on the common submount. The In the above example, common electrode connections to all VCSELs allows a common drive current to operate all the VCSELs together thereby, facilitating all the VCSELs to emit together, resulting in high output power. The bonding pads 204 and 205 although located on the same surface of the submount, are electrically isolated. While only one set of bonding pads are shown, the thermal submount may include more than one set of bonding pads for co-locating other VCSEL arrays such that VCSEL arrays are tiled to increase the total emission area and output power. The submount is further bonded on a heat sink (not shown in FIG. 2) to facilitate fast and efficient heat dissipation from the VCSEL arrays. In addition, simple optical methods described earlier may be applied to individual beam or collectively to the array, for producing a desirable illumination pattern or to focus the light from the VCSEL array. As a result, VCSEL arrays can be easily configured to provide uniform pumping beams that match the dimensions of a target gain medium.

In general, VCSEL arrays, especially arrays of single mode VCSELs, are typically very high speed devices and can be operated with pulse duration of the order of nanosecond or less, and rise times of sub-nanoseconds. Very compact high power VCSEL arrays facilitate minimizing electrical conductor lengths and reducing inductance as has been described in a U.S. patent application Ser. No. 13/337,098 filed on Dec. 24, 2011, by Seurin et al, and co-authored by some of the inventors in this application, and co-owned by a common assignee, the content of which is being incorporated by reference in its entirety. As a result, such a high speed VCSEL is therefore more suitable for applying fast rise time high drive current pulses thereby, facilitating generation of high energy short optical pulses from a VCSEL array. This aspect is beneficial for QCW and pulse operation of lasers pumped by pump modules described in this invention.

Figure 3:
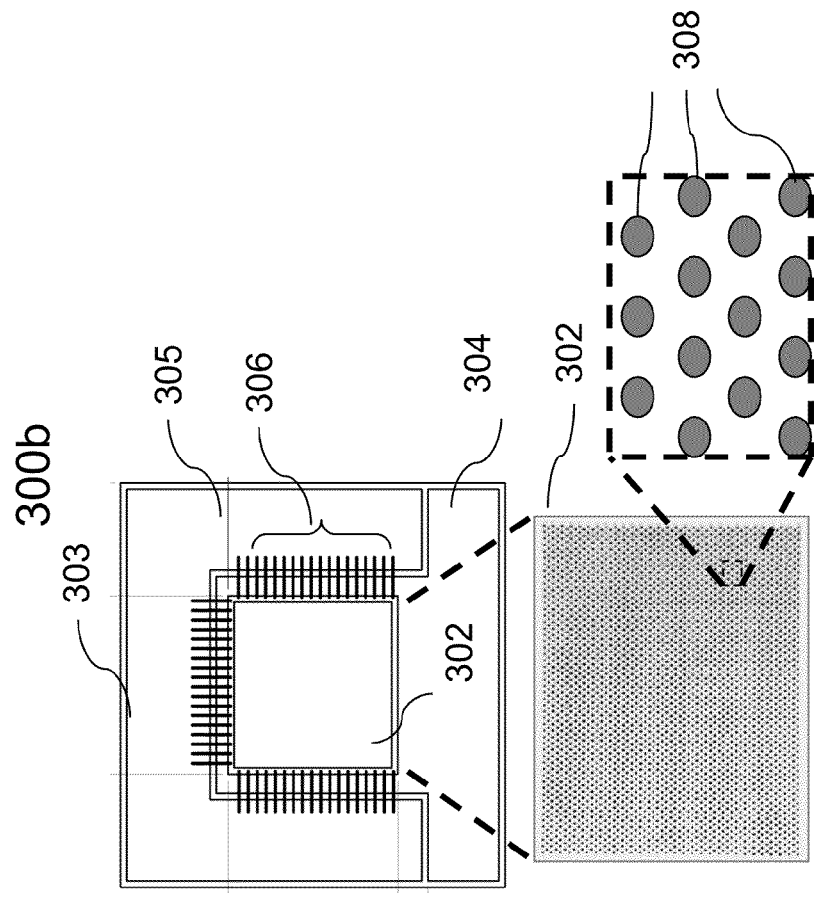
FIG. 3 shows a basic optical pump module configuration using a VCSEL array.
Figure 3:
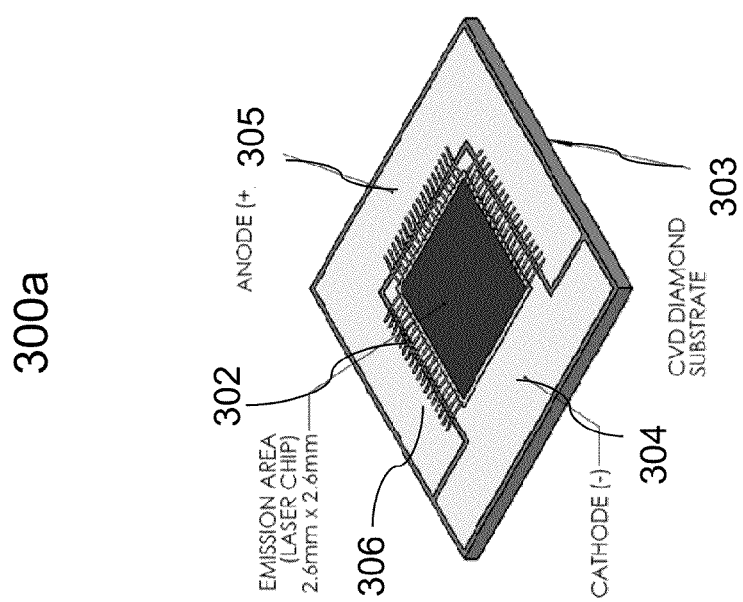

An exemplary high power VCSEL array module is shown in FIG. 3. In particular, a VCSEL array chip 300a and a corresponding plan view 300b with details of the array are shown therein. Identical features in the two views are labeled with same reference numeral for clarity and ease of discussion. More specifically, the chip comprises a VCSEL array 302 mounted on a heat spreading thermal submount 303. Each array includes a plurality of VCSELs 308 (only a few labeled for clarity) as shown in the expanded view, constructed on a common substrate (not visible in this view). The common substrate is configured as a cathode 304. A second terminal of each VCSEL in the array is wire bonded as an anode for the array using either individual wires or one or more wide ribbons collectively shown as 306 (only one labeled for clarity).

Figure 4:
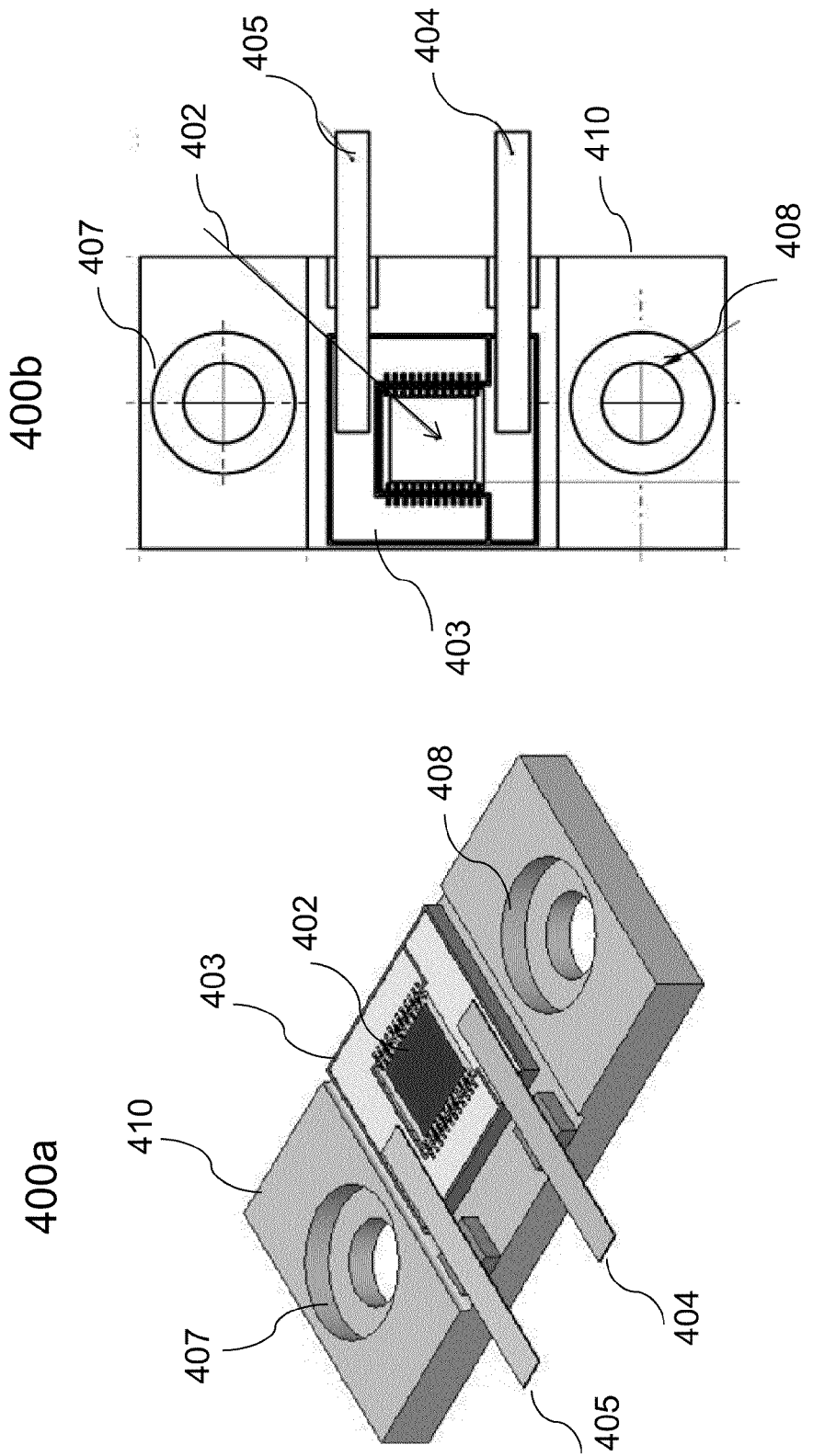
FIG. 4 shows an optical pump module using a single VCSEL array.

In one embodiment of a optical pump module shown in FIG. 4, a VCSEL array chip is bonded to a heat sink. More specifically, 400a shows an optical pump module together with a plan view 400b. The VCSEL array 402 mounted on a thermal submount 403 is bonded to a heat sink 410. The heat-sink is made of a high thermal conductivity material for example, copper. Two metallic strips 404 and 405 are connected to the cathode and the anode of the VCSEL chip array. The heat sink includes mounting holes 407 and 408, respectively, such that the entire module can be attached to a cooling device for example, a cooling fan, a honeycomb stage with flowing cooling fluid, cooling fins etc. that are well known in the art.

Figure 5:
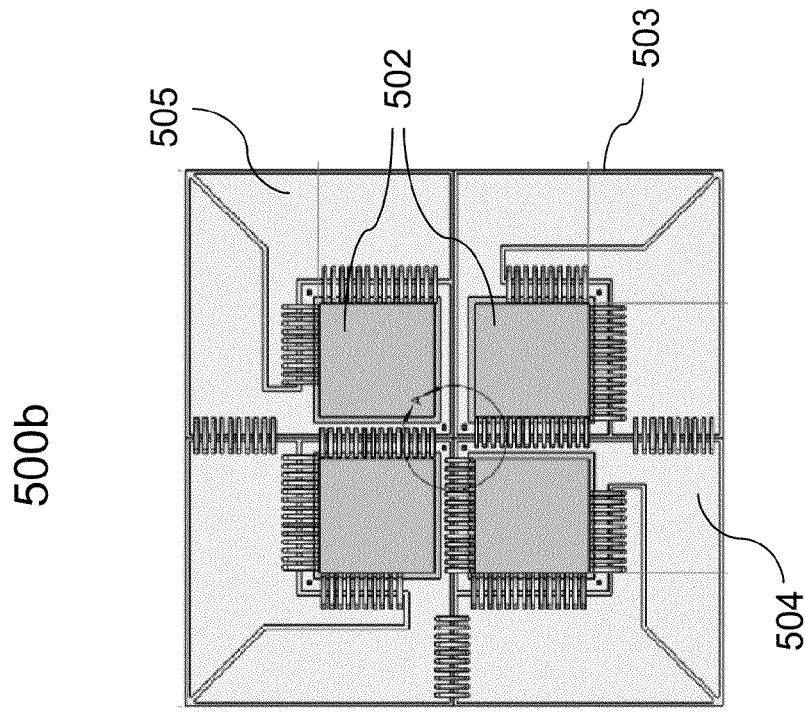
FIG. 5 shows an optical pump module arrangement including four VCSEL arrays to generate pump light in a square pattern.
Figure 5:
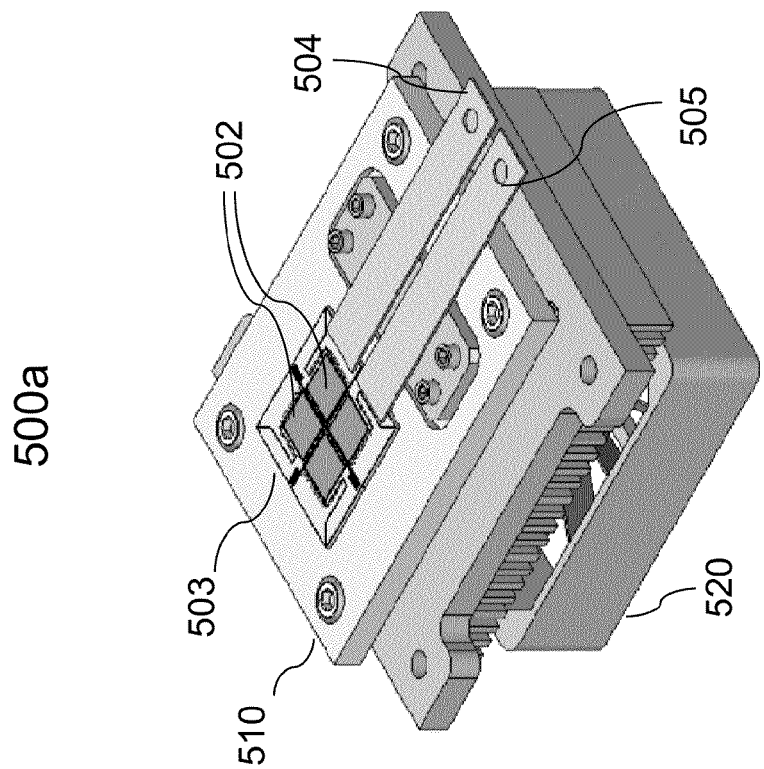

FIG. 5 shows an exemplary embodiment of a large area optical pump module 500a and a corresponding plan view of the VCSEL chip that is used to construct the module. In this embodiment a large area VCSEL chip is constructed by tiling four VCSEL chip arrays similar to the ones described in reference with FIG. 3. In particular, in a quad VCSEL chip, four square shaped VCSEL arrays 502 (only two of them are labeled) are bonded to a common thermal submount 503. The thermal submount includes a set of electrodes 504 and 505 to connect each VCSEL array to a common cathode and to one or more anodes depending upon the required output power. Although the schematic view in FIG. 5 shows one set of electrodes, additional set of electrodes may be included on the thermal submount. The unit is cooled by a fan 520, but other cooling methods such as liquid cooling is equally effective. Individual VCSEL array may be operated together or separately.

In this example all the VCSEL arrays are shown to have the same array dimension N×N (N is an integer>1). The pump module shown in FIG. 5 for example will generate pump light in a square area to match a gain medium having a square cross section. For example, a pump light emitted over a square area of about 2.6 mm×2.6 mm from the embodiment using a quad-VCSEL chip shown in FIG. 5, would generate an output power of about 100 W in an Nd:YAG gain medium operated at 808 nm in a QCW mode. In an exemplary quad-array pump module when all the VCSEL arrays are operated together, a QCW output power of about 400 W or higher may be achieved in a light emitting area of about 11 mm square. Typically, each VCSEL chip may include over one thousand VCSEL devices.

In reality, VCSEL arrays having different array dimensions N×M (N and M integers >1) may be tiled together to generate pump light having different emission shapes and areas. Advantageously, different shapes of pump beam emission may be effectively matched to different shapes of gain media cross section in a very simple and effective manner. For example in a solid state gain medium having a square cross-section or a circular cross section, the laser cavity mode is primarily circular, whereas in a gain medium in a rectangular cross section solid state gain medium, the cavity mode is primarily elliptical. It can be appreciated that tiling of the VCSEL arrays having same or different array dimensions, provides a lot of flexibility in tailoring the pump beam shape and area to match the cavity mode shape so as to facilitate absorption of the pump light in the gain medium. Advantageously, the unique aspect of tiling a variety of VCSEL arrays in constructing the pump modules described in this invention also provides flexibility in upgrading the pump power in a modular fashion. It should be noted that some high power module may have a few thousands of individual VCSEL devices arranged in a multi-dimensional arrays or arrays of several low dimensional arrays tiled together on a common submount.

Figure 6:
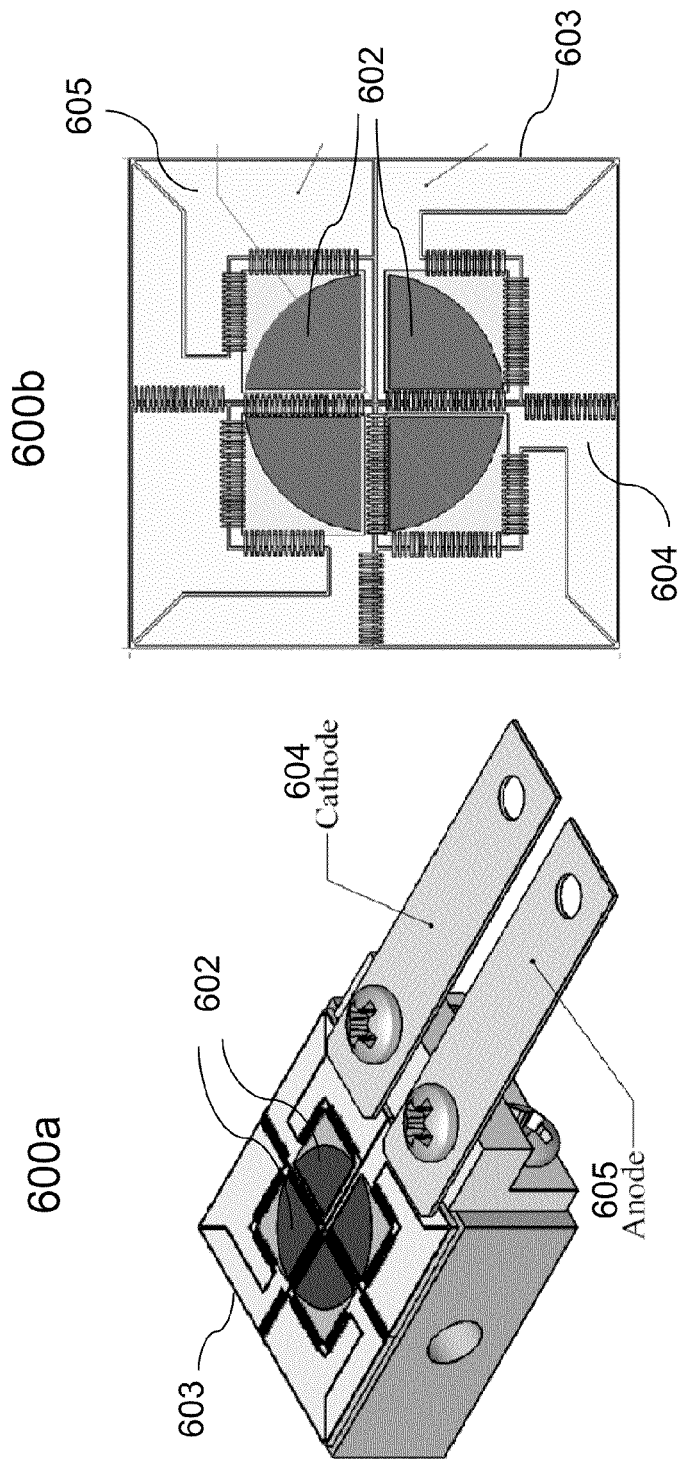
FIG. 6 shows an optical pump module arrangement with four quarter circle VCSEL arrays to generate pump light in a circular pattern.

For some applications it is useful to generate a pump light in a circular area such that the pumped region has a better overlap with a circular laser cavity mode. In FIG. 6 is shown another exemplary embodiment 600a with a corresponding plan view 600b of the VCSEL chip. In this embodiment, VCSEL arrays with quarter-circle emission areas 602 are tiled on a common thermal submount 603 to create a circular emitting area. Each quarter-circle emission area is comprised of several thousands of single VCSEL devices. Different VCSEL arrays may be connected to a respective set of electrodes 604 and 605 so that they may be operated together or separately for a desired output power. It may be noted that the VCSEL arrays may be arranged in different patterns so as to generate different shaped emission patterns. In an exemplary array configured using four quarter circles tiled to create a circular array of about 10 mm diameter, total output power of about 900 W in QCW operation is achieved.

Figure 7:
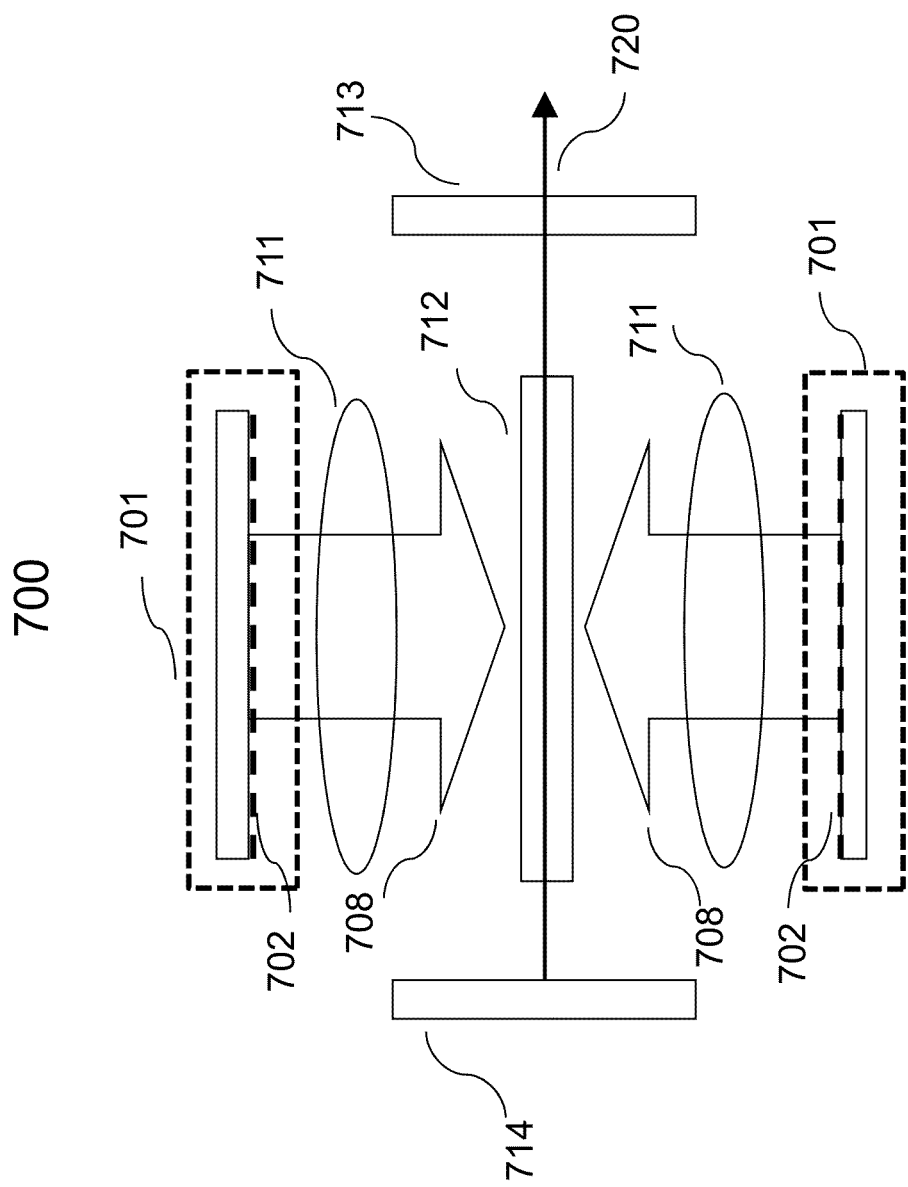
FIG. 7 shows a compact high power laser configuration using VCSEL array pump modules in a dual side-pumping configuration.

While the examples shown in FIGS. 5 & 6 illustrate 2×2 arrangements of VCSEL arrays, it is clear that any arrangements of N×M arrays can be used (N, M integers >=1). And while the VCSEL array chips will be square or rectangular, it is clear that the emission area within each array can be designed into any custom shape. Also, the electrical connection of the different arrays within the VCSEL module can be customized to meet certain operating drive current and voltage goals and/or to achieve some addressability at the array level. Those skilled in the art will recognize that the ability to design an optical pump module having a desired beam shape to match the shape of the cavity mode, provides added flexibility towards optimally coupling the pump light to the gain media Side-Pumping Configuration:

The optical pump modules described in the earlier section may be applied to pump a high power gain medium. Although the exemplary embodiments in the following discussion refers to a solid state gain medium, the principles illustrated through those embodiments are equally applicable to other gain media including but not limited to, solid state, semiconductor, gaseous, liquid or gel and optical fiber that are typically used in high power lasers. A simple configuration of a typical high power laser is schematically shown in FIG. 7. More specifically, a high power laser shown in schematic 700 comprises a gain medium 712 disposed in a resonant cavity constructed of at least two reflectors 713 and 714, respectively, in this exemplary embodiment. For example, for a solid state gain medium, reflective and/or antireflection coatings deposited at the end faces of the gain medium form the resonant cavity. For example, for a Nd:YAG gain medium, reflective coatings on the crystal facets form the cavity. At least one of the reflectors has a very high reflectivity and the other one is partially reflective to output part of the light generated within the cavity. In this example the axis 720 along the length of the gain medium represents the lasing axis along which the high power laser emission occurs.

In one embodiment of a side-pumping configuration, the gain medium is optically pumped from the side of the gain medium transverse to the lasing axis. In the exemplary embodiment shown in FIG. 7, one or more optical pump modules 701 including one or more VCSEL arrays 702 (only one labeled for clarity), similar to the ones described in reference with FIGS. 3, 4, 5 and 6 is placed along the length of the gain medium. In this view it appears that the VCSEL array 702 is a linear array, it should be noted that that the elements shown as 702 may be multi-dimensional arrays as well as arrays of VCSEL arrays of lower dimensions. In this example two pump modules are shown on the opposite sides of the gain medium. The size of the pump module is determined by the size and optical power required for pumping the gain medium for a desired laser output power. For example, for a small size gain medium a fan cooled small one-or two-dimensional VCSEL array module may be adequate, whereas for a frequency doubling application it may be necessary to use a higher power optical pump to generate adequate high CW/QCW power or for Q-switching for generating high energy pulses.

The pump light 708 from the VCSEL pump module is focused on one side of the gain medium using focusing optics. In this example the focusing optics is a single converging lens 711. However, it need not be so. Other focusing arrangements using multiple components that are well known in the art may be equally effective. Additional beam shaping elements integral to the VCSELs such as current confining apertures, or additional optical components may be included in the optical pump module 701 for achieving a desired shape of the optical pump emission pattern. For efficient coupling of the pump light, the focal distance of the focusing optics is set to coincide with the center of the gain medium such that the maximum pump power is incident at the center of the gain medium as compared to the edges. This intensity profile closely matches the laser mode intensity formed in the resonant cavity such that absorption of optical pump power by the gain medium is efficient. One advantage of matching the pump light profile to the laser mode is to absorb maximum pump power and reduce excess heat generation and related thermal lensing in the gain medium.

Figure 8:
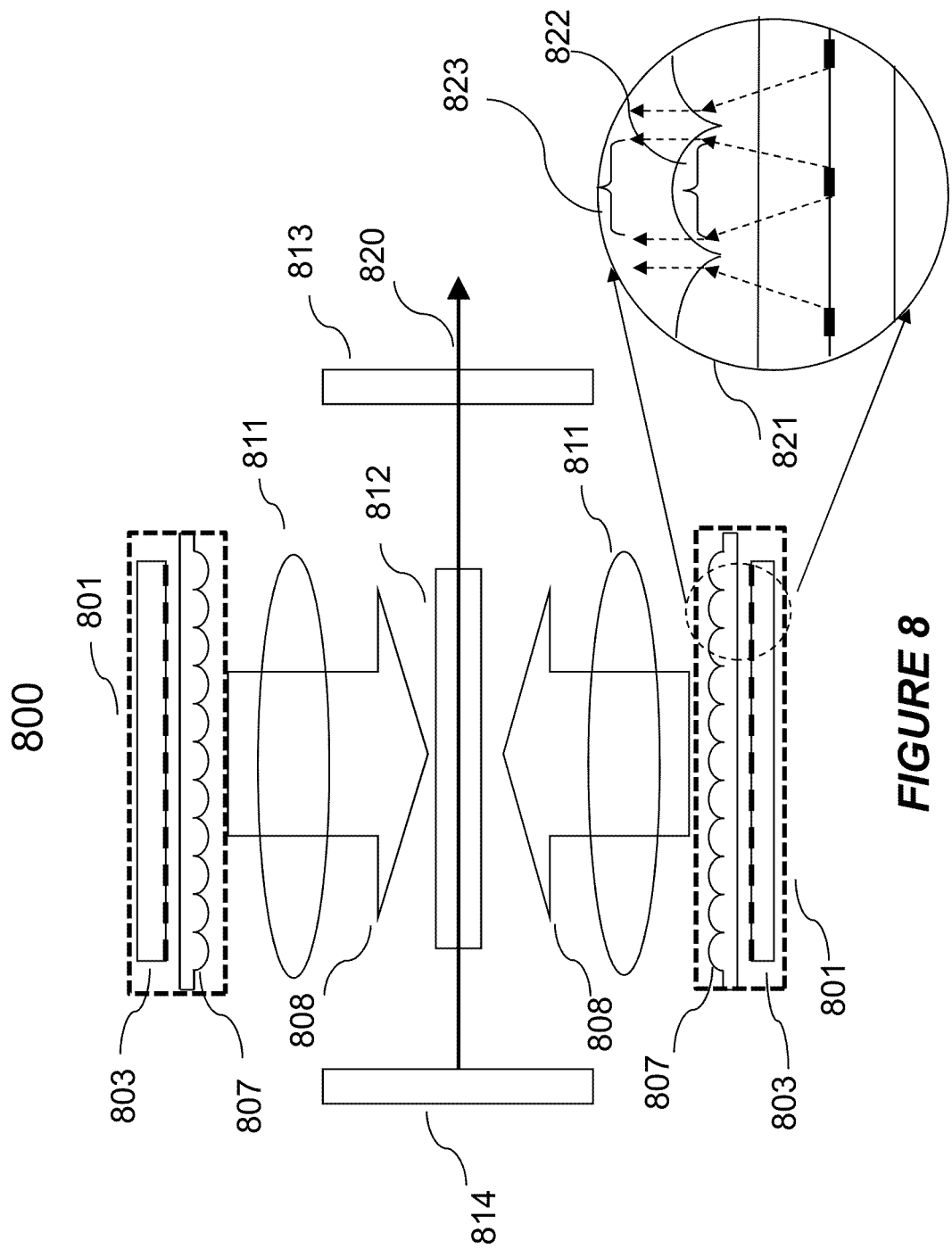
FIG. 8 shows a compact high power laser configuration using VCSEL array pump modules including microlens array in a dual side-pumping configuration.

In a different embodiment of the invention shown in FIG. 8, the optical pump is similar to that described in reference with FIG. 7. The elements that are common in FIGS. 7 and 8 are labeled with similar reference numerals and will not be described again for brevity. The difference between the embodiments shown in FIG. 7 and FIG. 8 is a microlens array 807 that is placed external to the VCSEL array pump module 801 at an appropriate distance. Two major benefits of this design aspect are as follows—as seen in the inset, individual beams emitted from the VCSEL first diverge and expand as indicated by a bracket 822. The expanded beams are then collimated into parallel beams 823. Furthermore, the distance between adjacent microlenses is selected according to the divergence of the VCSEL beams, such that individual VCSEL beams after collimation from the microlens array combine without any substantial gap in between, into a continuous cohesive beam. The combined output beam following the microlens array is focused into a more intense and uniform beam inside the gain medium using optics 811. As a result, more fraction of the pump optical power is coupled into the gain medium as compared to an arrangement without the microlens array. A detail description of attaching an external microlens array to a VCSEL array may be found in an earlier U.S. patent application Ser. No. 13/337,098 filed on Dec. 24, 2011, by Seurin et al, and incorporated by reference herein in its entirety.

Although use of microlens integrated with the VCSEL array, has been described in prior art publications particularly in the U.S. Pat. No. 6,888,871 issued Zhang et al on May 3, 2005, and in the U.S. Pat. No. 5,982,802 issued to Thony et al. on Nov. 9, 1999, there is a limitation in using integral microlenses. More specifically, a microlens or a microlens array integrated with a VCSEL or a VCSEL array, respectively, does not permit sufficient distance between the VCSEL and the microlens to allow the individual beams to expand and be formed into a single cohesive illuminating beam.

It is important to note that use of integrated microlens as described in the prior art is to focus the beam onto the gain medium whereas, in the example shown in FIG. 8, the microlens array in combination with a focusing lens placed external to the gain medium provides added functionality in expanding beams from individual VCSEL devices in the array and combine them into a more uniform and intense beam so as to couple optical power from the pump to the gain medium effectively.

In the embodiments shown in FIGS. 7 and 8 a dual pumping arrangement is used where two pump modules are placed directly across from each other on opposite sides of the gain medium. One particular advantage of this arrangement comes from the fact that performance of a VCSEL is not affected by back-reflections of the emitted beam towards the VCSEL. By same principle, light from one pump module transmitted through the gain medium and incident on the other pump module does not damage the pumps. Any pump radiation that is transmitted through the gain medium and not absorbed can be reflected back without destabilizing the VCSEL. As a result, it is possible to pump the gain medium from opposite ends by placing pump modules directly opposite to each other. Thus the pump light reflected off of the pump module placed on the opposite side, is returned into the gain medium and is reabsorbed. Consequently, the pump power that would have been otherwise lost may be absorbed in the gain medium.

Figure 9:
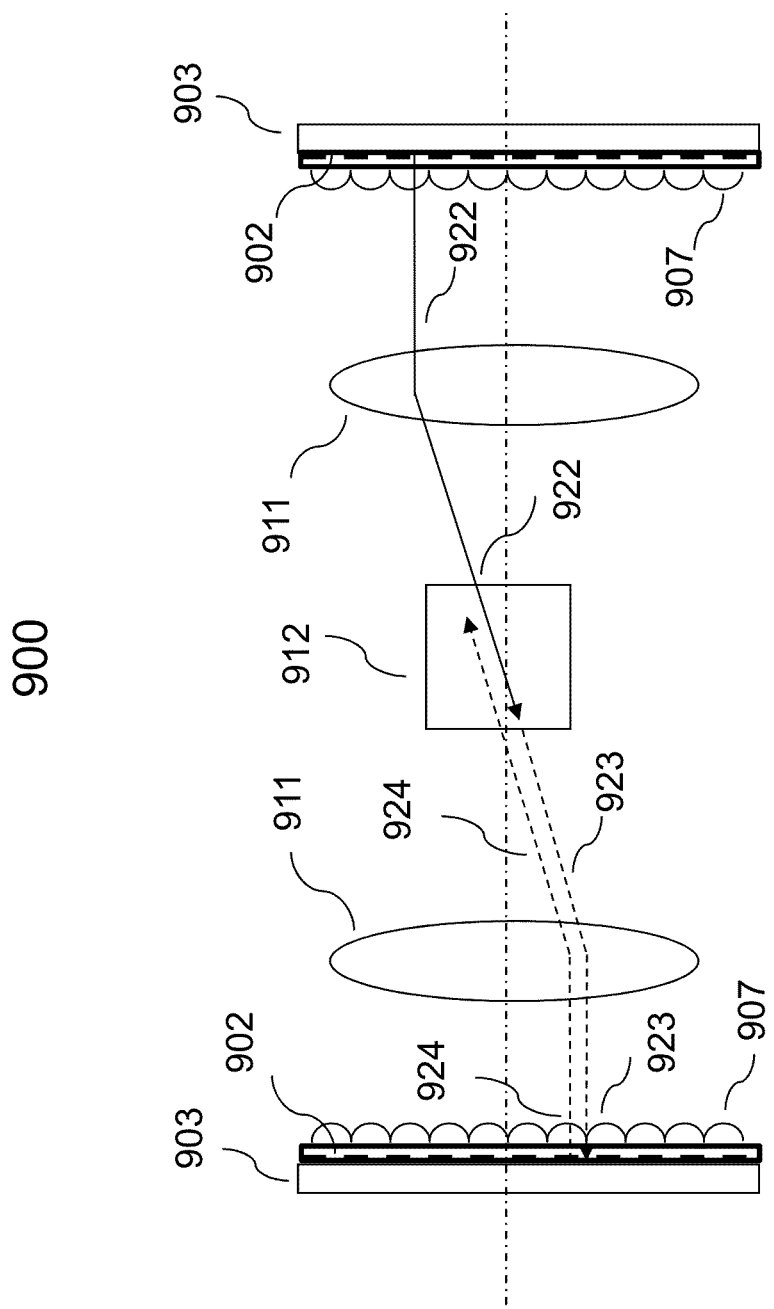
FIG. 9 shows a cross section view of a compact high power laser configuration depicting multi-pass absorption from oppositely positioned VCSEL array pump modules.

This aspect of the invention is further illustrated in reference with FIG. 9. In the schematic view 900 a cross section view of the reflective cavity is shown such that the mirrors forming the reflective cavity are not visible in this view. More specifically, the gain medium 912 has a square cross section and the laser axis along the length of the gain medium is the axis going in the paper. The elements that are common in FIGS. 7, 8 and 9 are represented by identical reference numerals and will not be described again for brevity. A gain medium 912 is placed in a cavity with two optical pump modules 901 symmetrically placed on opposite sides of the gain medium such that the front metalized surface of the VCSEL chips face each other. For simplicity, the pump modules are shown without the heat sinks or the cooling arrangement. Two microlens arrays 907 are placed between the pump modules and respective converging lens 911 on either side of the gain medium. The microlens arrays collimate the pump light originating from each VCSEL in the array into a cohesive uniform pump beam. The cohesive uniform pump beams are focused using the respective converging lenses into high power pump beams.

In the schematic view, a focused pump beam represented as 922 originates from the pump module placed on the right of the gain medium 912. Some fraction of the pump beam is coupled to the gain medium and the fraction not absorbed in the gain medium exits the gain medium as a beam 923 (shown in dashed line). The remaining pump beam 923 is reflected off of the metalized surface of VCSEL chip of the second pump module placed on left of the gain medium. The reflected beam shown as 924 (in dashed line) traverses back towards the gain medium and some fraction of it is absorbed into the gain medium.

It should be noted that in the U.S. Pat. No. 7,430,231 issued to Luo et al. on Sep. 30, 2008, a specially designed diffusion chamber or a parabolic reflector is used to couple light from VCSEL arrays to a gain medium. The arrangement described therein requires additional design complexity and incurs power losses due to imperfections and absorption of a small amount of power at additional surfaces at the diffuser/parabolic reflector. Those skilled in the art will be able to appreciate the simplicity and efficiency of the method described in this invention over other prior art counterparts.

While the process is explained showing only one set of the pump beams, it is equally applicable for pump beam originating in the pump module located on the left of the gain medium. It can be appreciated that in each pass of this multiple reflection process some energy from the pump beam is coupled to the gain medium. As a result, coupling of the pump power to the gain medium is more efficient. It is important to note that unlike edge emitting lasers, VCSEL emission is not affected by back reflections. Therefore, it is possible to place a VCSEL pump module directly facing another pump module such that a larger fraction of the pump light is absorbed without incurring significant power loss. The principles described in reference to FIG. 9 may be expanded to accommodate more pump modules to further increase pump power or to pump differently shaped gain medium. Although the aspect of re-absorption of pump light is explained in reference with an embodiment including microlens arrays, the same effect of re-absorption of pump energy is present in the embodiments shown in FIGS. 7 and 8 as well.

Figure 10:
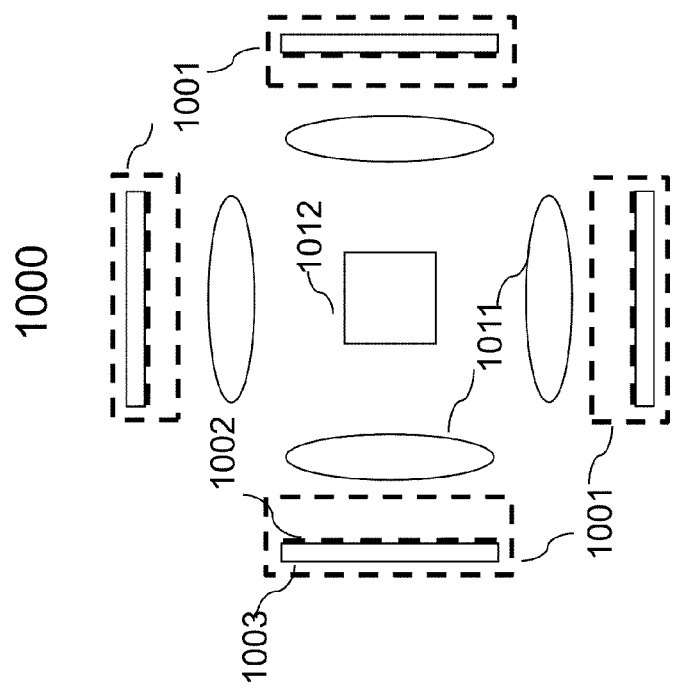
FIG. 10 shows a cross section view of a compact high power laser configuration using four VCSEL array pump modules.

FIG. 10 shows an embodiment of the invention to increase the pump power by a factor of two over the pumping scheme shown in FIG. 9. The embodiment shown in the schematic view 1000 works substantially similar to the one described in reference with FIG. 9 except for additional pump modules. In this exemplary configuration, four identical pump modules 1001 are placed around a gain medium 1012 having a square cross section. Pump power form each module is focused on the gain medium using a respective converging lens 1011. Although not shown here, additional microlens arrays may be included to make the pump beam more uniform.

Although the principles of increasing the pump power is explained using identical pump modules, in other embodiments pump modules having different output power may be used effectively. Arrangement of pump modules may be tailored to accommodate gain medium having other shapes. For example, to pump a high power gas laser in an enclosure having a circular cross section, pump modules of different shapes and/or power may be arranged around the circumference of the enclosure. Those skilled in the art will be able to appreciate that unlike other prior art pump systems, the principles of this invention allows upgrading/downgrading pump power according to needs in a simple modular fashion without designing additional components or structures, to accommodate different shape, size and/or volume of the gain medium.

Figure 11:
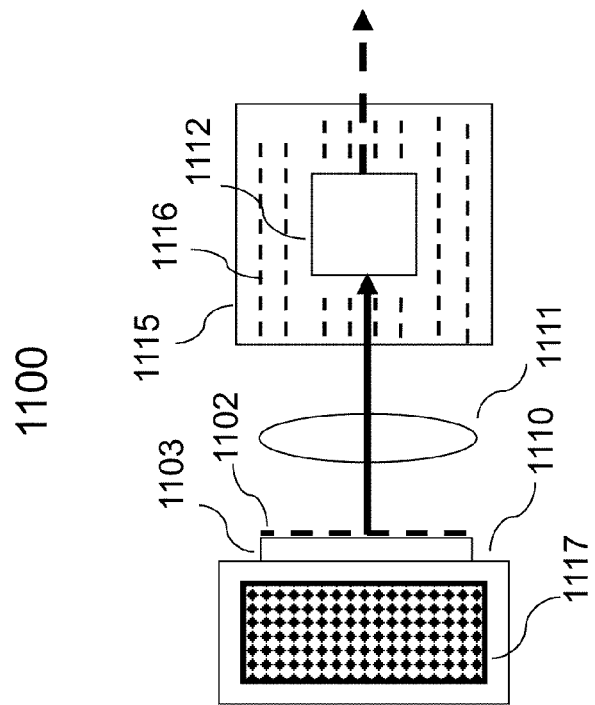
FIG. 11 shows a cross section view of a compact high power laser system utilizing separate cooling systems for the gain medium and the optical pump module.

One distinguishing aspect of this invention is that the cooling arrangement for the gain medium may be separated from the cooling arrangement for the pump module thereby, allowing the gain medium and the pump modules to be operated at respective optimum temperatures. Furthermore, different types of cooling arrangements may be used for optimizing space and performance for the gain medium and the pump modules. In an embodiment shown in FIG. 11, separate and efficient cooling of the gain medium 1112 and VCSEL pump module 1101 is demonstrated. More specifically, the gain medium is enclosed in a transparent container 1115 with a liquid 1116 flowing through the container for cooling the gain medium. The container material allows transmission of the VCSEL pump beam (shown with bold arrows). The VCSEL array 1102 mounted on a thermal submount 1103 is placed on a heat dissipating stage 1110 using a liquid cooled microchannel cooler 1117. Although a simple focusing optics 1111 similar to that described earlier is shown, additional components such as a microlens array may be included as well for directing the pump light to the gain medium. It can be appreciated that upgrading output power described earlier in reference with FIG. 10, by adding additional pump modules each having a separate independent cooling arrangement, does not interfere with other pump coolers or the gain medium cooler.

Figure 12:
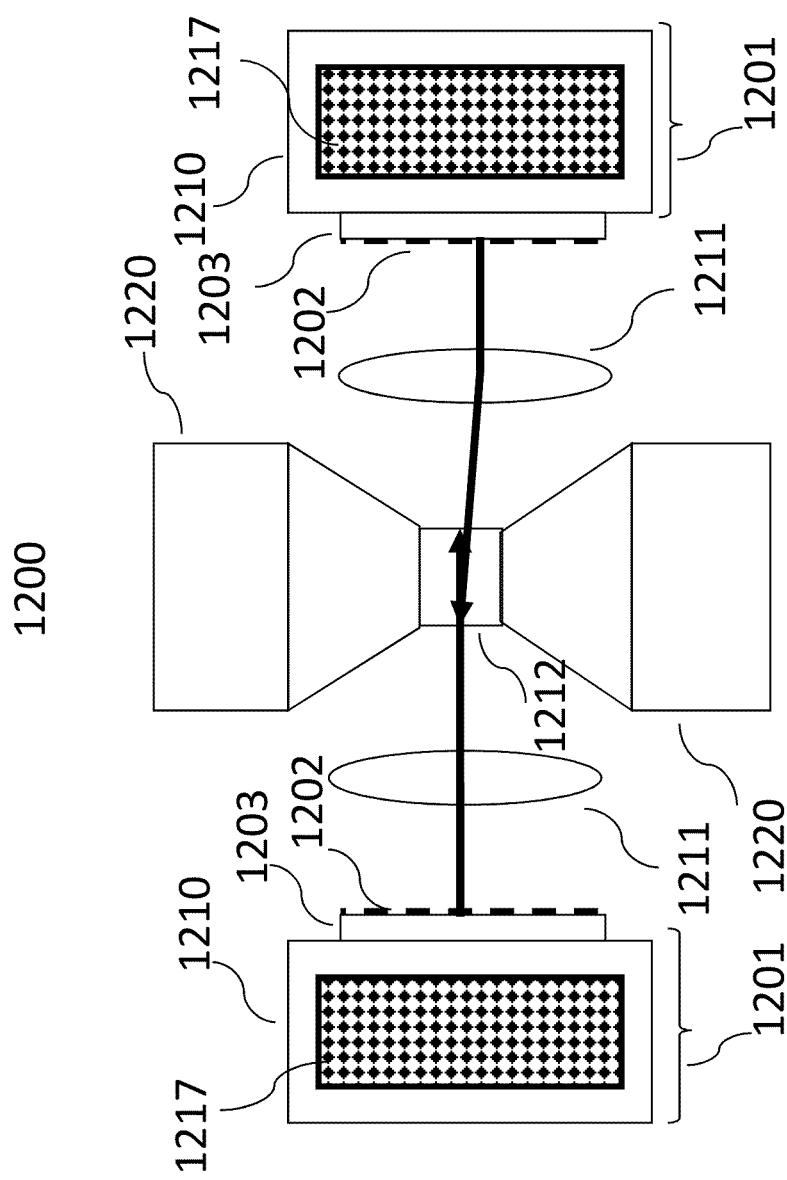
FIG. 12 shows a cross section view of a compact high power laser system utilizing separate cooling systems for the gain medium and the optical pump module in a dual side-pumping configuration.
Figure 13:
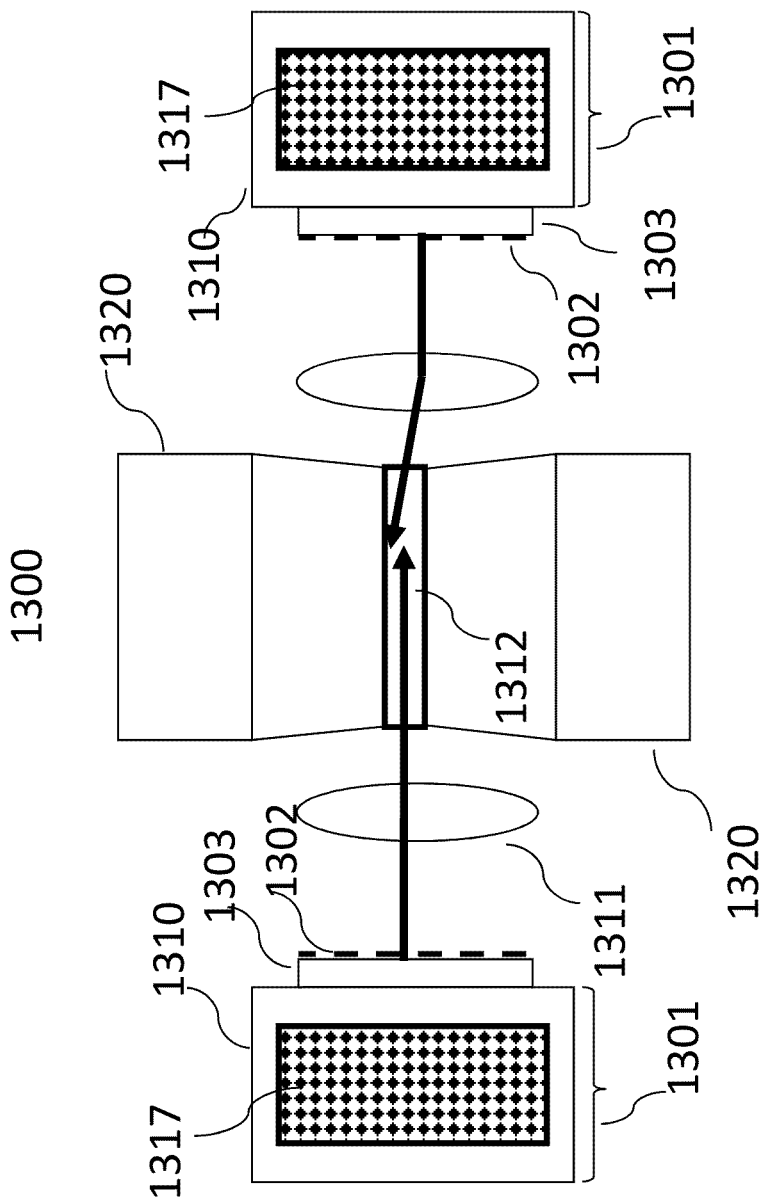
FIG. 13 shows a cross section view of a thin slab gain medium in a dual side-pumping configuration.

Embodiments shown in FIGS. 12 and 13 illustrate some other cooling methods particularly suitable for a solid state gain medium. Referring now to FIG. 12, a cross section of a laser cavity is shown where the laser axis is into the plane of the paper. The elements shown in this embodiment are substantially similar to the elements shown in FIG. 11 and are identified by similar reference numerals. Those elements will not be described again for brevity. A square cross section gain medium 1212 is conductively cooled by bonding one or more large surface area heat sinks 1220 to one or two surfaces of the gain medium. The heat sinks may include cooling fins or spikes to circulate cold air or a cooling liquid. The pump modules collectively shown as 1201 are cooled separately using respective liquid cooled microchannel cooler 1217 included in the respective heat sinks 1210 similar to the one described in reference with FIG. 11. It can be seen that the coolers provided with the gain medium as well as with the pump modules do not interfere with the focusing optics and the pumping operation described earlier in reference with FIG. 9.

In an alternative arrangement shown in FIG. 13, the gain medium is configured as a thin slab having a large gain volume as well as a large surface area. The elements having similar functionalities in this embodiment and embodiment shown in FIG. 12 are labeled with similar reference numerals and will not be described again for brevity. The gain medium 1312 in this embodiment is disposed in the form of a thin slab. A high reflectivity mirror coated on one side of the thin slab and a coupler mirror placed on the opposite side of the mirrored surface, form the laser feedback cavity. The laser cavity in this embodiment is constructed such that the laser beam is emitted perpendicular to the thin slab and perpendicular to the pump light direction rather than parallel to the thin slab. The gain medium 1312 may be cooled using conductive cooling arrangement 1320 disposed from one or two large area surfaces. The pump modules are cooled separately as described in reference with FIG. 12.

Figure 14:
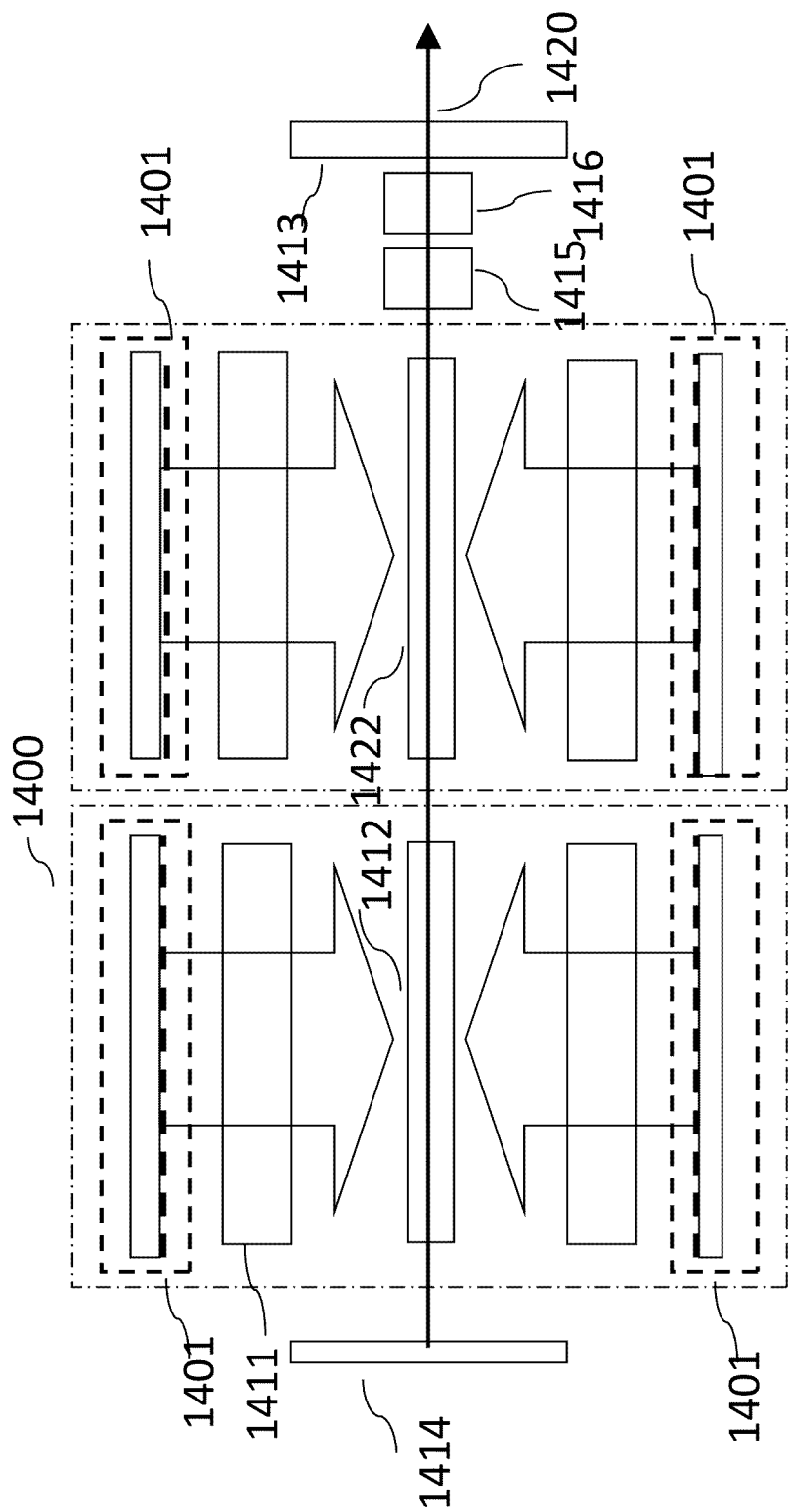
FIG. 14 shows a schematic view of a laser system including two gain medium segments to depict scalability.

Higher output power from the laser may be achieved by adding more length to the gain medium. However, there are practical considerations such as physical strength of a very large gain medium, for example a longer crystal for a solid state gain medium may be more prone to damage or breakage. A practical solution to increase the length of the gain medium is to place smaller segments of gain medium co-linearly within the same cavity as shown in a different embodiment of the invention in FIG. 14. In this exemplary embodiment, two segments of gain media 1412 and 1422 are placed in a common resonant cavity formed by two reflectors 1413 and 1414, respectively, along the lasing axis marked as 1420. In this configuration the reflector 1413 is partially reflective to transmit the laser output. The ends of the gain medium segments are antireflection coated for the pump wavelength as well as the fundamental lasing wavelength such that, the reflectors 1413 and 1414 are the only feedback elements of the cavity rather than the ends of each gain medium segment. The laser can be operated in CW, QCW or pulsed mode. For the CW laser the cavity would be of the type shown in FIG. 13. However, for short pulsed operation the laser cavity also includes other components that are well known in the art such as, a polarizer 1415 and a Q-switch element 1416.

Although the gain medium segments shown here are substantially similar, it need not be so. The length of the gain medium segments is determined by the required laser power. The gain medium segments may be cooled by separate cooling arrangement or a common cooling arrangement depending upon the total length of the gain medium. The option for cooling each gain medium segment separately allows for reduction in size and complexity of cooling arrangement that would otherwise be required for a single large size gain medium. A respective set of pump modules are arranged to side-pump each segment of the gain medium allowing full control over the pump power required to pump that segment independently. As described earlier, each pump module includes a VCSEL array chip mounted on a thermal submount that is bonded to an independent heat sink (details of the pump module are shown in FIGS. 2, 3, 4, 5 and 6 in this application). It can be appreciated that the design described in this invention is modular, thereby allowing a lot of flexibility in upgrading the laser output power by appropriate selection of pump modules, gain media and other peripheral elements, without increasing the system complexity and redesigning the entire system.

Figure 15:
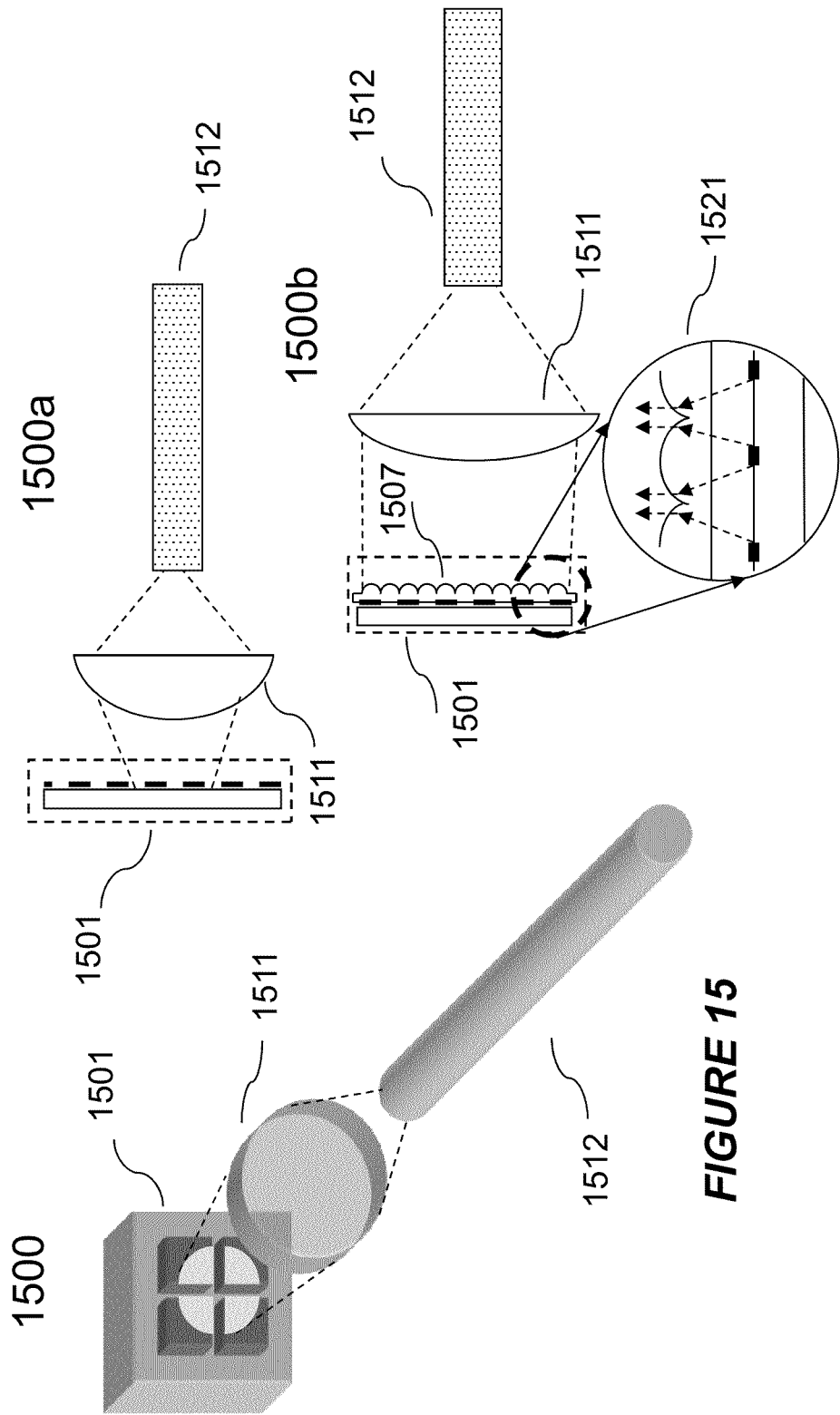
FIG. 15 shows schematic views of an end-pumping configuration.

End-Pumping Configuration:

The pump modules described earlier may also be configured to pump a gain medium from an end. Pumping from the end of the gain medium provides the full longitudinal dimension of the gain medium for absorbing the pumping light, and thereby making the laser less sensitive to temperature tuning of the wavelength of the pump and absorption wavelengths of the gain medium. Referring to FIG. 15, there it shows a simple schematic view 1500 depicting application of a VCSEL pump module for end-pumping a gain medium. More specifically, pump light from a VCSEL pump module 1501 is coupled to one end of a gain material 1512 using a focusing optics 1511, which is a simple converging lens in this exemplary embodiment. In particular, the VCSEL pump module is configured using a quad VCSEL array comprising four VCSEL arrays with quarter circle emissions areas, as illustrated in FIG. 6. In this configuration, the pump module generates a uniform circular light beam having high output power. Although the exemplary embodiment shows a rod of gain medium, gain media having other cross section geometry for example, for a solid state laser rod, a gaseous gain medium enclosed in a cylindrical enclosure may be used without any digression from the principles of the invention.

In a typical high power laser, there are other optical components for example the reflective surfaces forming the cavity, a Brewster plate, the Q-switching element for pulsed operation, the polarizer, etc. Q-switching component is not used for CW operation. For clarity, such components are not shown in FIG. 15 and in some latter drawing figures as well. However, it should not be construed that these elements forming essential parts of the laser system are precluded from the description. The line diagrams 1500a and 1500b in FIG. 15 show examples of co-linear light coupling between the pump module and the gain medium using two different configurations that are substantially similar and perform substantially similar functions. In 1500a, a single converging optics is shown to focus the pump light on to the end of the gain medium. In 1500b, an additional microlens array 1507 is placed externally, between the focusing optics 1511 and the pump module 1501 such that the emission from individual VCSELs in the array are expanded and collimated to achieve a cohesive uniform pump beam as shown in the inset 1521 and explained earlier in reference with FIG. 8.

Figure 16:
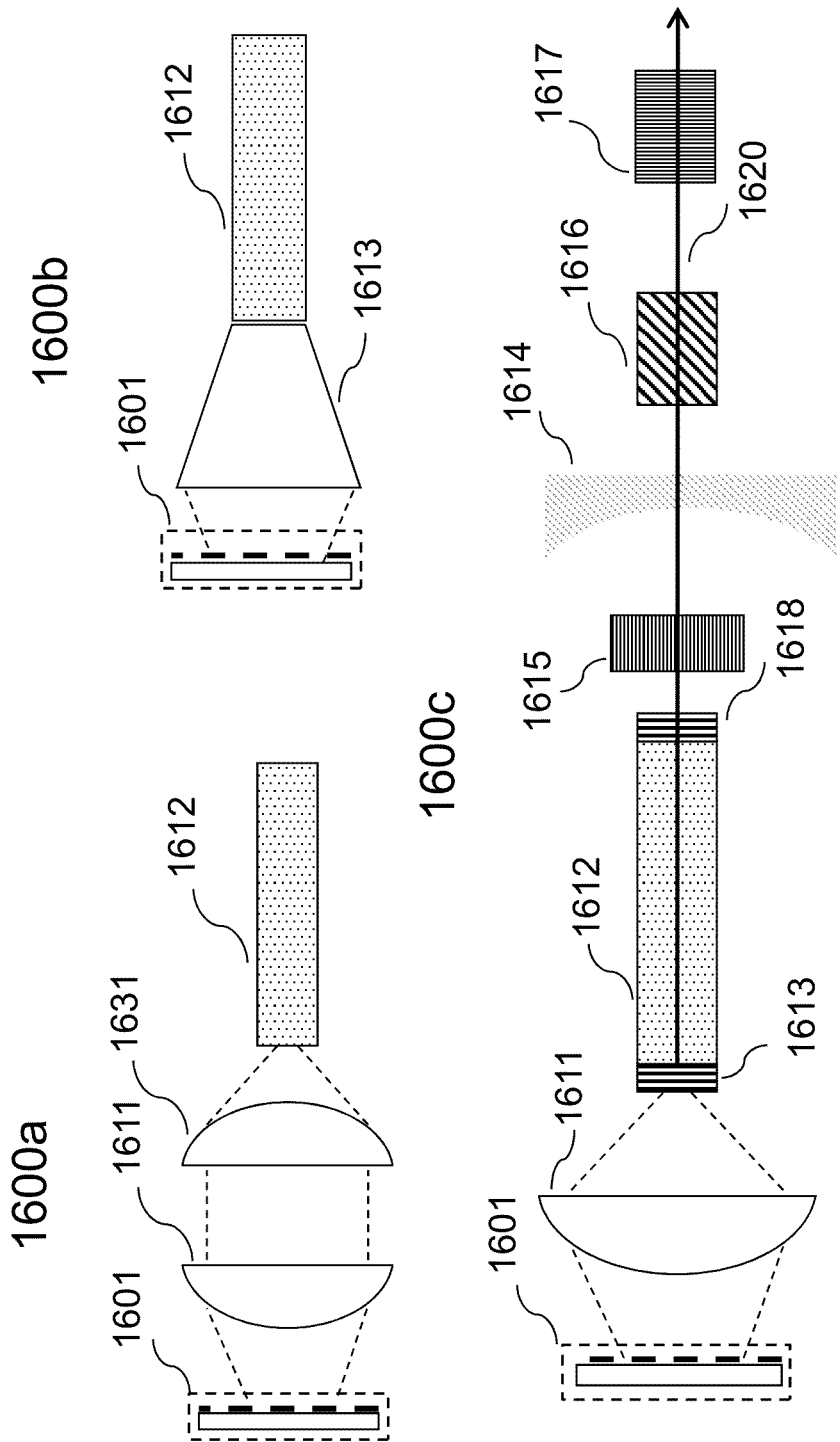
FIG. 16 shows schematic views of co-linear end-coupling schemes to pump a gain medium.

Other configurations for co-linear coupling are shown in 1600a and 1600b in FIG. 16. In the focusing arrangement shown in 1600a, a lens doublet including a pair of plano-convex lenses 1611 and 1631 is used. The lenses having different refractive indices in appropriate combination are selected so as to cancel chromatic and spherical aberrations that would otherwise reduce the sharpness of the image formed on to the gain medium end. A sharper image of the pump beam results in more efficient coupling of the pump power to the gain medium. Lens pair in a doublet can be air-spaced, cemented together with an optically transparent adhesive, or separated by a thin oil film, and is well known and documented in the art.

Yet another type of coupling optics that may be employed to focus pump emission into the end of a laser is an adiabatic tapered optical waveguide. As shown in 1600b, a tapered waveguide 1613 is used to focus light from the VCSEL pump module 1601 into the end of the gain medium 1612. Other elements forming the laser cavity are not shown for clarity. Tapered adiabatic waveguides work on the principle that light incident on a surface of different index of refraction at small grazing angles has very low loss. They have been used to couple laser emission into fibers and fibers to fibers where their advantages of low loss and high tolerance to lateral displacement make them well suited for coupling. The waveguide 1613 is typically a hollow or a solid funnel-shaped tapered structure.

More specifically, light from the pump module is coupled to the large end of the tapered waveguide without any focusing lens(es) in between, and the smaller end of the tapered waveguide is placed butt-coupled, in direct contact with the end of the gain medium. Light from the VCSEL is coupled into the large end of the taper. Since the waveguide is highly insensitive to lateral displacement, alignment would not be critical. The pump module may be butt-coupled or spaced away from the waveguide. It can be appreciated that in a configuration where the tapered waveguide is placed butt-coupled to the pump module as well as the gain medium, particularly, for a solid state gain medium with the ends coated with reflective surfaces, to form the laser cavity, the entire structure may be constructed in an integrated form thereby, reducing the size of the laser, while still allowing for high pump powers. It should be further noted that the design principles illustrated through the selected examples are equally applicable for embodiments including a microlens array placed in front VCSEL array pump module as described in reference to 1500b shown in FIG. 15.

Advantageously, emission from VCSEL array pump module is symmetric therefore it is possible to end-pump a gain medium co-linearly using simple optical components. As a result, an entire high power laser system is more compact, less complex and uses less power. In FIG. 16, an exemplary embodiment of the invention is shown in the schematic 1600c. In this embodiment, a high power laser is configured in a co-linear arrangement. More specifically, pump power from a VCSEL array pump module 1601 is focused on an end of a gain medium 1612 using a focusing optics 1611, which is a converging lens in this exemplary embodiment. One end of the gain medium is coated with a coating 1613 that is antireflecting at the lasing wavelength while being transparent for the pump wavelength and highly reflecting at the solid-state laser wavelength and, which forms a laser cavity with a spherical curved reflector 1614 that is partially reflective at the laser wavelength forms the solid-state output coupler for the laser.

In a variant configuration flat mirrors may be used in appropriate positions to form the cavity. The second end of the gain medium has a coating 1618 that is anti reflecting at the pump wavelength. The laser cavity may also include a Q-switch element 1615 for pulsed operation which is not required for CW operation. The entire laser system is co-linear around the lasing axis 1620. While one preferred arrangement is shown and described in this example, other arrangements for assembling high power lasers following simple design principles outlined in this invention may occur to those skilled in the art.

Figure 17:
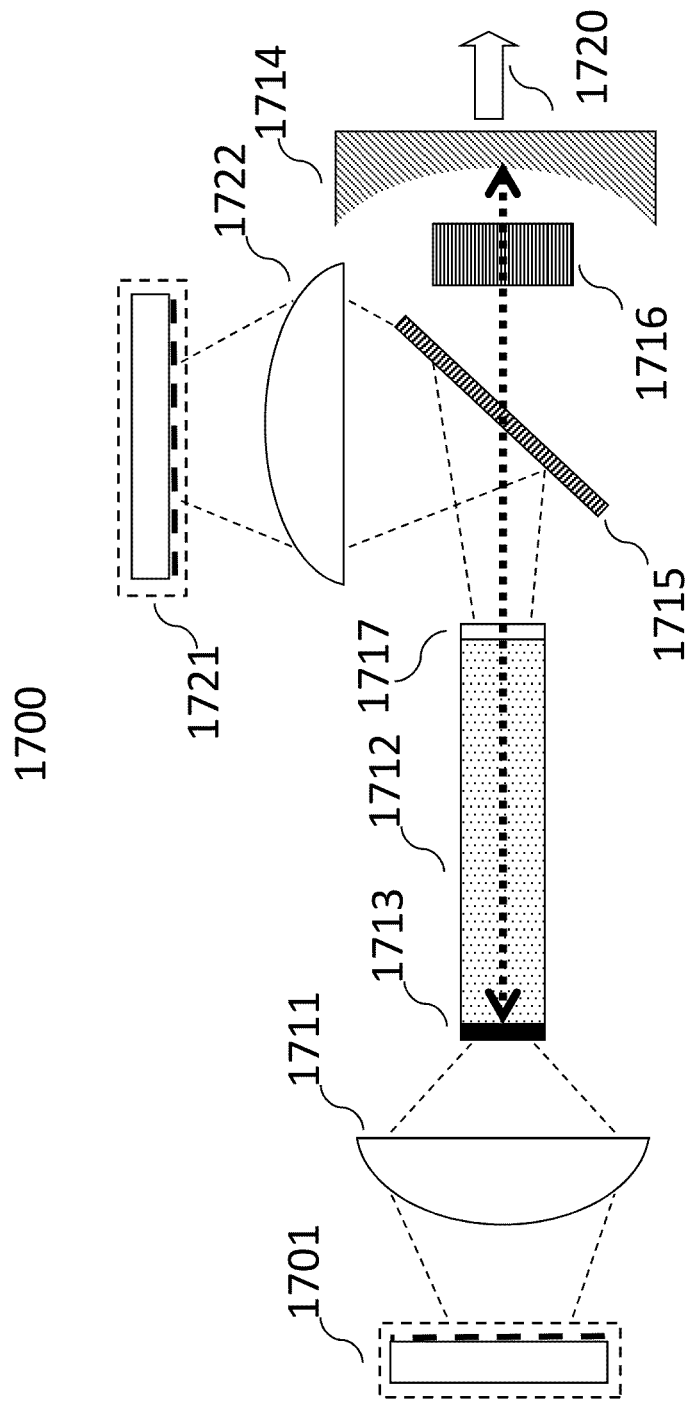
FIG. 17 shows a schematic view of dual end-pumping configuration.

The simple co-linear configuration of an end-pumped high power laser described earlier in reference with FIG. 16 is extended to configure a dual end-pumped high power laser shown in FIG. 17. Although the basic principles of the embodiment 1700 will be described in reference with a solid state gain medium for example, a Nd:YAG crystal having a fundamental emission at 1064 nm, the same principles may be extended to other types of gain media within the broad framework. More specifically, a high power laser comprising a gain medium 1712 is placed in a laser resonant cavity constructed using a high reflectivity reflector 1713 and a partially reflective spherical curved mirror 1714 for the laser output 1720. Both ends of the gain medium are antireflective at 808 nm, coinciding respectively with the laser fundamental mode and pump wavelengths in this exemplary configuration Two VCSEL array pump modules 1701 and 1721 pump the gain medium at its two ends. More specifically, the pump module 1701 is arranged co-linearly whereas, the second pump module 1721 is placed at a right angle to the gain medium. Appropriately selected focusing optics are placed between the respective pump module and the gain media to focus the pump beam on to a corresponding gain medium end. For example, for the pump module 1701, it may be a simple converging lens 1711 whereas, for the pump module 1721, the focusing optics includes a lens 1722 and a reflective surface 1715 at a 45 degree angle with respect to the laser axis to direct the pump beam on to the gain medium end. The reflective surface has high reflectivity at the pump wavelength and is anti-reflective at the wavelength of the laser fundamental mode (808 nm and 1064 nm, respectively for this particular example). In addition, the laser cavity may include other optional components such as a Q-switch 1716 for pulsed operation that is well known in the art of high power laser applications.

Figure 18:
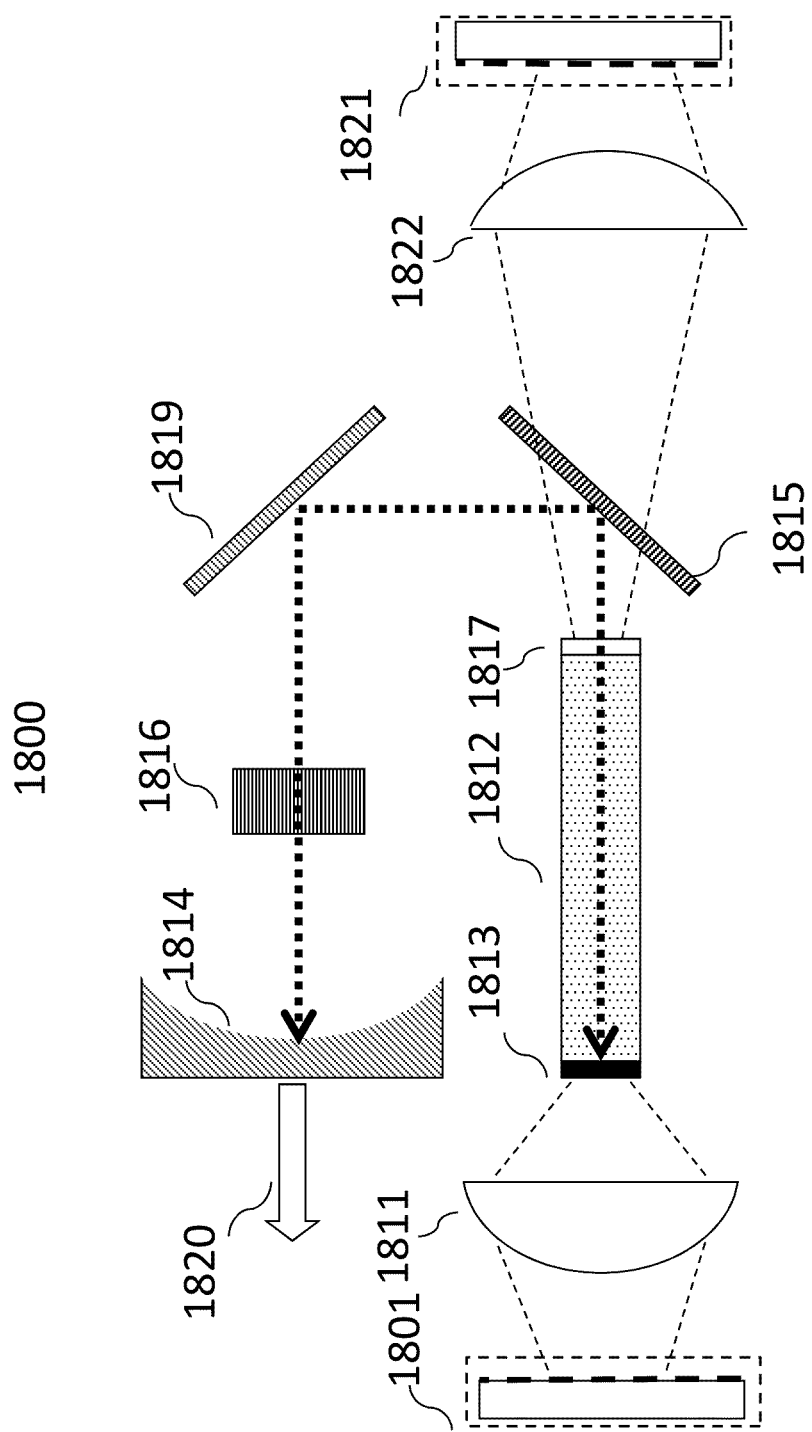
FIG. 18 shows a schematic view of an alternative dual end-pumping configuration.

Another configuration for applying dual-end pumping is represented in an embodiment shown in FIG. 18. The embodiment 1800 has similar elements and functions substantially similar to the one described in reference with FIG. 17 except for the laser cavity design. The elements that are identical in FIGS. 17 and 18 are labeled using similar reference numerals and have been already described in reference with FIG. 17. Same description will not be repeated in reference with FIG. 18 for brevity. The embodiment will be described in reference with a solid state gain medium but the principles are equally applicable for other types of gain media.

In particular, a solid state gain medium 1812 is placed in a resonant cavity comprising a first reflector 1813 having a high reflectivity and a second spherical reflector 1814 that is partially reflective to transmit the laser output 1820. In this embodiment, the lasing path represented by the double headed dashed arrow, is defined by placing two additional reflectors 1815 and 1819 at 45° angles with respect to the axis of the gain medium. The reflector 1815 is highly reflective at 1064 nm and anti-reflective at 808 nm, whereas the reflector 1819 is highly reflective at 1064 nm.

In this configuration, one end of the gain medium including the reflector 1813 is highly reflective at 1064 nm and anti-reflective at 808 nm, which are the wavelengths corresponding to the fundamental laser mode and the pump modules 1801 and 1821, respectively. The end 1817 of the gain medium distal of the reflector 1813 is anti-reflective at wavelengths 808 nm and 1064 nm to facilitate end-coupling from a second pump module 1821, as well as to prevent the laser mode to leak from that end of the gain medium. A Q-switch 1816 is also included for its intended purpose as described in reference with the embodiment shown in FIG. 17.

In this dual-end pumped configuration, pump light from two pump modules 1801 and 1821 placed on each end of the gain medium, is end-coupled to the gain medium through respective focusing optics 1811 and 1822. The focusing optics includes a simple converging lens or a combination of optical components. For example, focusing optics to couple light form the pump module 1821 includes the reflector 1815 having the anti-reflective coating at the pump wavelength. Other focusing optics may include but is not limited to a microlens array placed in front of the pump module and has been described earlier in reference with FIGS. 9 and 15.

Figure 19:
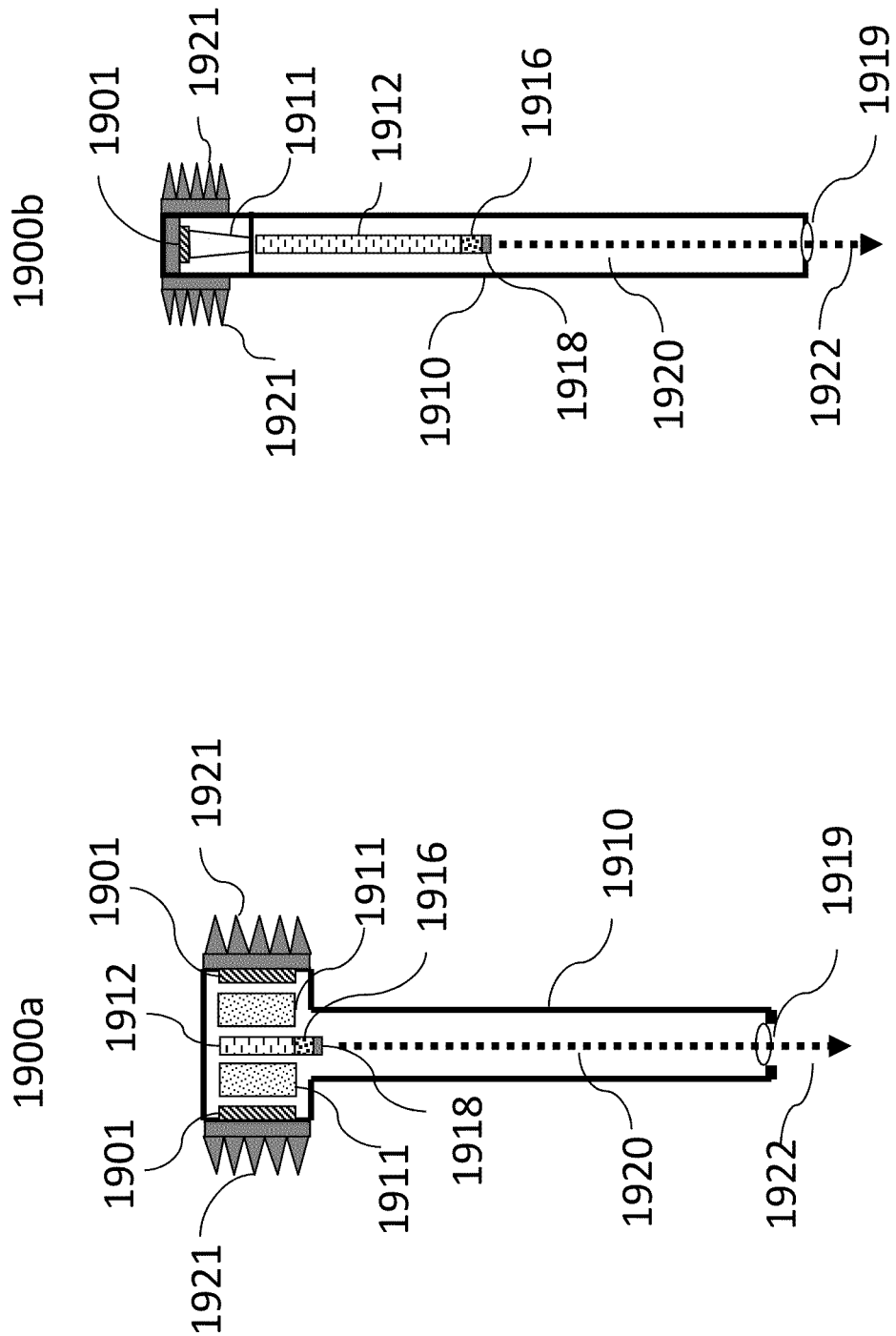
FIG. 19 shows an example of a compact high power laser system for generating a high energy pulses from a compact solid state laser.

The principles of the invention described in the illustrative examples are applied to construct a compact high power short pulsed solid state laser for producing ignition in the high temperature environment of an internal combustion engine for automotive or stationary power generation or pulse detonation aircraft engines. The laser device shown in FIG. 19 may be constructed in side-pump configuration or in end-pump configuration shown as 1900a and 1900b, respectively. Elements that are similar or perform similar functions are numbered with same reference numerals so that repetitive description is limited. Referring to the embodiment shown as 1900a, the laser device enclosed in a housing 1910, comprises a solid state laser rod 1912 placed in a resonant cavity formed by reflective coatings applied to the ends of the rod.

Light from VCSEL array pump modules 1901 (only two shown here) are coupled to the laser rod from the sides, using appropriate focusing optics 1911. In the alternative arrangement 1900b the laser rod 1912 is end-pumped using a high power VCSEL array pump module. In the examples shown in 1900a and 1900b, the pump power is focused using a converging lens. The focusing optics may include but are not limited to, a plano-convex lens, a plano-convex lens doublet, a microlens array, cylindrical lens, a glass waveguide, a Fresnel lens, etc. in one of the many configurations described earlier in reference with FIGS. 7, 8, 15 and 16. The pump modules are air cooled by cooling fins 1921. The laser cavity includes a Q-switch 1916 and the output coupler coating 1918. The laser beam 1920 is coupled out of the housing a focusing lens 1919 to generate a high energy short pulse emission 1922 (for example a spark in a combustion engine chamber).

An exemplary Q-switched solid state laser is constructed using an Nd:YAG rod having a diameter of a few millimeter and a length of about a centimeter. The laser rod is placed in an enclosure with a pump having three VCSEL array modules together with focusing optics placed between the pump modules and the laser rod. The enclosure has a length of about 7" and respective diameters of about 1" and 0.7" at the optical pump end and at the laser emission end, respectively. The laser emission end of the enclosure has a converging lens. The exemplary optically pumped laser device generates an output pulse having 24 mJ power and a pulse duration of 15 ns.

It must be noted that the invention is described in different embodiments of pump modules. In practice, an optical pump is constructed by assembling one or more modules considering factors that include but are not limited to, type, size and shape of the gain media, required pump power and mode of pumping viz., side-or end-pumping mode, to achieve a desired output power from the laser. Accordingly, the pump modules for constructing an optical pump are selected to have different size VCSEL chips including different size arrays, different number of arrays, multiple arrays of VCSEL arrays, etc. to generate different power output levels in different shape and/or size of the emission area. Furthermore, for clarity of representation and ease of description and discussion in the exemplary dual pumping embodiments of the invention the pump modules are represented as identical blocks. In reality, each pump module in a dual pumping optical pump may not be identical. The pump modules in an optical pump is selected with due consideration to the laser gain media to be used in designing a high power lasers.

The invention described in terms of its preferred embodiments is intended to provide a complete framework of the invention in various combinations and sub-combinations of the embodiments that may be applied in constructing an optical pump module. Applications of the principles embodied in these descriptions would result in many design choices that will occur to those skilled in the art. All such variations resulting in different devices, yet embodying the principles illustrated through the selected examples are implicitly covered within the broad framework of the invention. All such variations and modifications of the present invention are intended to be covered in appended claims.

What is claimed is:

1. An optical pump for a high power laser comprising:
   at least a first optical pump module including;
      a high power VCSEL chip, said VCSEL chip further including,
         at least one VCSEL array having a plurality of VCSEL devices, wherein a respective first terminal of each VCSEL device are connected together to a first electrical contact, and a respective second terminal of each VCSEL device connected together to a second electrical contact,
      a heat spreading mount including at least two contact pads of which at least a first contact pad covers a large area on the mount, wherein the VCSEL array is bonded to the first contact pad such that the first electrical contact is electrically connected to the first contact pad, and the second electrical contact is electrically connected to a second contact pad, such that the first and second contact pads form a first and second electrode of the pump module;
   wherein, the optical pump is positioned proximal to a laser resonant cavity, for coupling the pump light to a gain medium placed in the resonant cavity.

2. The optical pump as in claim 1 wherein, the VCSEL chip further includes a plurality of VCSEL arrays for enhancing total output power, wherein the plurality of VCSEL arrays are arranged in pre-determined patterns on the VCSEL chip, such that the light emitted from the first pump module covers an area having a pre-determined shape.

3. The optical pump as in claim 2 wherein the VCSEL chip includes four square shaped VCSEL arrays for emitting a square beam.

4. The optical pump as in claim 2 wherein the VCSEL chip includes four quarter circle VCSEL arrays for emitting a circular beam.

5. The optical pump as in claim 1, wherein the optical pump is positioned on one side of the resonant cavity, such that the pump light is incident on one side of the gain medium in a direction perpendicular to a central axis, and wherein the gain medium placed co-linear with the central axis in the direction substantially parallel to the laser emission.

6. The optical pump as in claim 5 including one or more focusing optics placed at a pre-determined distance between the first pump module and the gain medium, said focusing optics including one or more lens, a lens doublet, a microlens array, a tapered waveguide or a combination thereof.

7. The optical pump as in claim 6 further including a microlens array disposed at a pre-determined distance between the first pump module and the focusing optics comprising a converging lens, such that the intensity of the pump light incident on the gain medium is substantially enhanced.

8. The optical pump as in claim 1 further including a second optical pump module comprising:
   a high power VCSEL chip, said VCSEL chip further including,
      at least one VCSEL array having a plurality of VCSEL devices, wherein a respective first terminal of each VCSEL device are connected together to a first electrical contact, and a respective second terminal of each VCSEL device connected together to a second electrical contact,
   a heat spreading mount including at least two contact pads of which at least a first contact pad covers a large area on the mount, wherein the VCSEL array is bonded to the first contact pad such that the first electrical contact is electrically connected to the first contact pad, and the second electrical contact is electrically connected to a second contact pad, such that the first and second contact pads form a first and second electrode of the pump module;
   wherein, the second pump module is positioned on a second side of the resonant cavity opposite to the first side, such that the pump light from the second module is incident on the gain medium from a second side that is opposite to the first pump module.

9. The optical pump as in claim 8 wherein, the VCSEL chip includes a plurality of VCSEL arrays to enhance total output power, wherein the plurality of VCSEL arrays are arranged in pre-determined patterns on the VCSEL chip, such that the light emitted from the first pump module covers an area having a pre-determined shape including square, rectangular and circular beam.

10. The optical pump as in claim 8 including one or more focusing optics placed at a pre-determined distance between the second pump module and the gain medium, said focusing optics including one or more lens, a lens doublet, a microlens array, a tapered waveguide or a combination thereof.

11. The optical pump as in claim 10 further including a microlens array disposed at a pre-determined distance between the second pump module and the focusing optics comprising a converging lens, such that the intensity of the pump light incident on the gain medium is substantially enhanced.

12. The optical pump as in claim 1 further including a second pump module, wherein the first and second pump modules are arranged co-linear with the gain medium, such that the pump light from the first and second pump modules are incident co-linearly from two opposite ends of the gain medium via respective focusing optics placed at respective pre-determined distances between each end of the gain medium and the first and second pump modules, respectively.

13. The optical pump as in claim 12, wherein said focusing optics includes one or more lens, a lens doublet, a microlens array, a tapered waveguide or a combination thereof.

14. The optical pump as in claim 13 further including respective microlens arrays disposed at pre-determined distances between the first and second pump modules and respective focusing optics comprising converging lenses, such that the intensity of the pump light incident on each end of the gain medium is substantially enhanced.

15. The optical pump as in claim 1, wherein the first optical pump module is positioned co-linear with the gain medium along a central axis that is substantially parallel to the direction of laser emission, such that the pump light is coupled to the gain medium from one end using focusing optics placed at an appropriate distance between the first pump module and the gain medium.

16. The optical pump as in claim 15, wherein said focusing optics includes one or more lens, a lens doublet, a microlens array, a tapered waveguide or a combination thereof.

17. The optical pump as in claim 16 further including a microlens array disposed at an appropriate distance between the first pump module and the focusing optics comprising a converging lens, such that the intensity of the pump light incident on the first end of the gain medium is substantially enhanced.

18. The optical pump as in claim 15, further including a second optical pump module comprising:
- a high power VCSEL chip, said VCSEL chip further including,
  - at least one VCSEL array having a plurality of VCSEL devices, wherein a respective first terminal of each VCSEL device are connected together to a first electrical contact, and a respective second terminal of each VCSEL device connected together to a second electrical contact,
  - a heat spreading mount including at least two contact pads of which at least a first contact pad covers a large area on the mount, wherein the VCSEL array is bonded to the first contact pad such that the first electrical contact is electrically connected to the first contact pad, and the second electrical contact is electrically connected to a second contact pad, such that the first and second contact pads form a first and second electrode of the pump module;
- wherein, the second pump module is positioned at a 45° angle with respect to the resonant cavity at a predetermined distance, wherein the pump light from the second optical module is coupled to the gain medium using focusing optics and an additional reflector placed at respective predetermined distances between the second pump module and the gain medium such that, the pump light from the second pump module is incident co-linearly on a second end of the gain medium opposite to the first end.

19. The optical pump as in claim 18, wherein said focusing optics includes one or more lens, a lens doublet, a microlens array, a tapered waveguide or a combination thereof.

20. The optical pump as in claim 19 further including a microlens array disposed at an appropriate distance between the second pump module and the focusing optics comprising a converging lens, such that the intensity of the pump light incident on the second end of the gain medium is substantially enhanced.

21. The optical pump laser as in claim 1 wherein, the gain medium comprises one or more segments aligned co-linearly along a central axis that is substantially parallel to the laser emission, and wherein a plurality of optical pumps are positioned to pump a respective segment of the gain medium from respective sides of the resonant cavity.

22. The gain medium as in claim 1 including a solid state medium, a semiconductor, a gaseous medium, a liquid, a gel or an optical fiber.

23. The optical pump as in claim 1 including a plurality of optical pump modules positioned around the gain medium, each pump module including one or more VCSEL chips, wherein the number of optical pump modules is determined according to the cross section shape of the gain medium such that the combined light from the pump modules is coupled to the gain medium uniformly from all sides.

24. The laser resonant cavity as in claim 1 further including a Q-switch.

25. An optical pump arranged to pump a compact solid state pulse laser, said optical pump comprising:
- one or more optical pump modules, each pump module further comprising;
  - a high power VCSEL chip, said VCSEL chip further including,
    - at least one VCSEL array having a plurality of VCSEL devices, wherein a respective first terminal of each VCSEL device are connected together to a first electrical contact, and a respective second terminal of each VCSEL device connected together to a second electrical contact,
  - a heat spreading mount including at least two contact pads of which at least a first contact pad covers a large area on the mount, wherein the VCSEL array is bonded to the first contact pad such that the first electrical contact is electrically connected to the first contact pad, and the second electrical contact is electrically connected to a second contact pad, such that the first and second contact pads form a first and second electrode of each pump module,
- wherein the optical pump is placed co-linear with a resonant cavity including a compact solid state gain medium and a Q-switch, along a central axis of an enclosure, wherein the one or more pump modules are connected together to collectively generate pump light having a high output power that is focused on the gain medium using focusing optics placed at predetermined distance from the gain medium such that upon pumping the gain medium short laser pulses are emitted.

26. The optical pump as in claim 25 wherein the focusing optics includes one or more lens, a lens doublet, a microlens array, a tapered waveguide or a combination thereof.

27. The optical pump as in claim 26 further including a respective microlens array disposed at a predetermined distance between each pump module and the corresponding focusing optics comprising a converging lens, such that the intensity of the pump light incident on the gain medium is substantially enhanced.

* * * * *